United States Patent
Rajendran et al.

(10) Patent No.: US 12,529,954 B2
(45) Date of Patent: Jan. 20, 2026

(54) IN-SITU IN-BAND AND OUT-OF-BAND SPECTRAL MEASUREMENT FOR EUV TOOLS

(71) Applicant: KLA Corporation, Milpitas, CA (US)

(72) Inventors: Rajeev Rajendran, San Francisco, CA (US); Michael Xie, Shanghai (CN); Farid Atry, San Jose, CA (US); Florian Melsheimer, Cologne (DE); Rui-Fang Shi, Cupertino, CA (US)

(73) Assignee: KLA Corporation, Milpitas, CA (US)

( * ) Notice: Subject to any disclaimer, the term of this patent is extended or adjusted under 35 U.S.C. 154(b) by 235 days.

(21) Appl. No.: 18/514,874

(22) Filed: Nov. 20, 2023

(65) Prior Publication Data

US 2025/0164895 A1  May 22, 2025

(51) Int. Cl.
*G03F 1/84* (2012.01)
*G01N 21/956* (2006.01)
*G03F 7/00* (2006.01)

(52) U.S. Cl.
CPC .............. *G03F 1/84* (2013.01); *G01N 21/956* (2013.01); *G03F 7/706849* (2023.05); *G03F 7/706851* (2023.05); *G01N 2021/95676* (2013.01)

(58) Field of Classification Search
CPC ............ G01N 2021/95676; G03F 1/84; G03F 7/706849; G03F 7/70633; G03F 7/706851; G03F 7/70625; G03F 7/70616; G03F 7/706847; G03F 7/7085; G03F 7/7065; G03F 7/706845
See application file for complete search history.

(56) References Cited

U.S. PATENT DOCUMENTS

| | | | |
|---|---|---|---|
| 6,469,827 B1 | 10/2002 | Sweatt et al. | |
| 2006/0243923 A1 | 11/2006 | Seki | |
| 2008/0252731 A1 * | 10/2008 | Blais-Ouellette | G01J 3/02 |
| | | | 348/E5.085 |

(Continued)

FOREIGN PATENT DOCUMENTS

| | | | | |
|---|---|---|---|---|
| WO | 2009123733 A1 | 10/2009 | | |
| WO | WO-2024256136 A1 * | 12/2024 | ............ | G01J 1/0437 |

OTHER PUBLICATIONS

PCT/US2023/083463, International Search Report, Aug. 8, 2024.

(Continued)

*Primary Examiner* — Steven H Whitesell
(74) *Attorney, Agent, or Firm* — Huse IP Law

(57) ABSTRACT

A substrate is mounted on a chuck in a chamber of an EUV tool. An illumination aperture in the chamber provides a beam of light to illuminate the substrate on the chuck. The beam of light includes extreme ultraviolet (EUV) in-band (IB) light and out-of-band (OOB) light. The OOB light has longer wavelengths than the EUV IB light. A beam-narrowing aperture in the chamber, which is switchable into and out of a path for the beam of light, selectively narrows the beam of light to illuminate the substrate. A band-selection filter filters out the OOB light or the EUV IB light. Imaging optics in the chamber relay light from the substrate to an imaging plane. A grating spectrally disperses the light from the substrate. A sensor detects the light from the substrate as relayed by the imaging optics and spectrally dispersed by the grating.

23 Claims, 16 Drawing Sheets

(56) References Cited

U.S. PATENT DOCUMENTS

| | | | | |
|---|---|---|---|---|
| 2012/0235049 | A1* | 9/2012 | Wang | H10F 39/805 |
| | | | | 250/372 |
| 2013/0028273 | A1* | 1/2013 | Lee | G03F 7/70025 |
| | | | | 372/5 |
| 2017/0221194 | A1* | 8/2017 | Ebstein | G01N 21/956 |
| 2017/0350575 | A1* | 12/2017 | Hill | G01J 3/0229 |
| 2018/0136568 | A1* | 5/2018 | Roobol | G01N 21/8806 |
| 2020/0264515 | A1 | 8/2020 | Cho et al. | |
| 2020/0401037 | A1* | 12/2020 | Huang | G01N 21/956 |
| 2022/0390320 | A1* | 12/2022 | Koch | G01M 11/0207 |
| 2022/0392660 | A1* | 12/2022 | Lebert | G03F 7/702 |
| 2024/0361704 | A1* | 10/2024 | Gwosch | G03F 7/70625 |
| 2024/0377753 | A1* | 11/2024 | Farsad | G03F 7/702 |
| 2024/0377761 | A1* | 11/2024 | Kuzucu | G02B 5/1828 |

OTHER PUBLICATIONS

PCT/US2023/083463, Written Opinion of the International Searching Authority, Aug. 8, 2024.

Stearns, D. G. et al., "Multilayer mirror technology for soft-x-ray projection lithography," Appl. Opt. 32, 6952-6960 (1993) (Year: 1993).

* cited by examiner

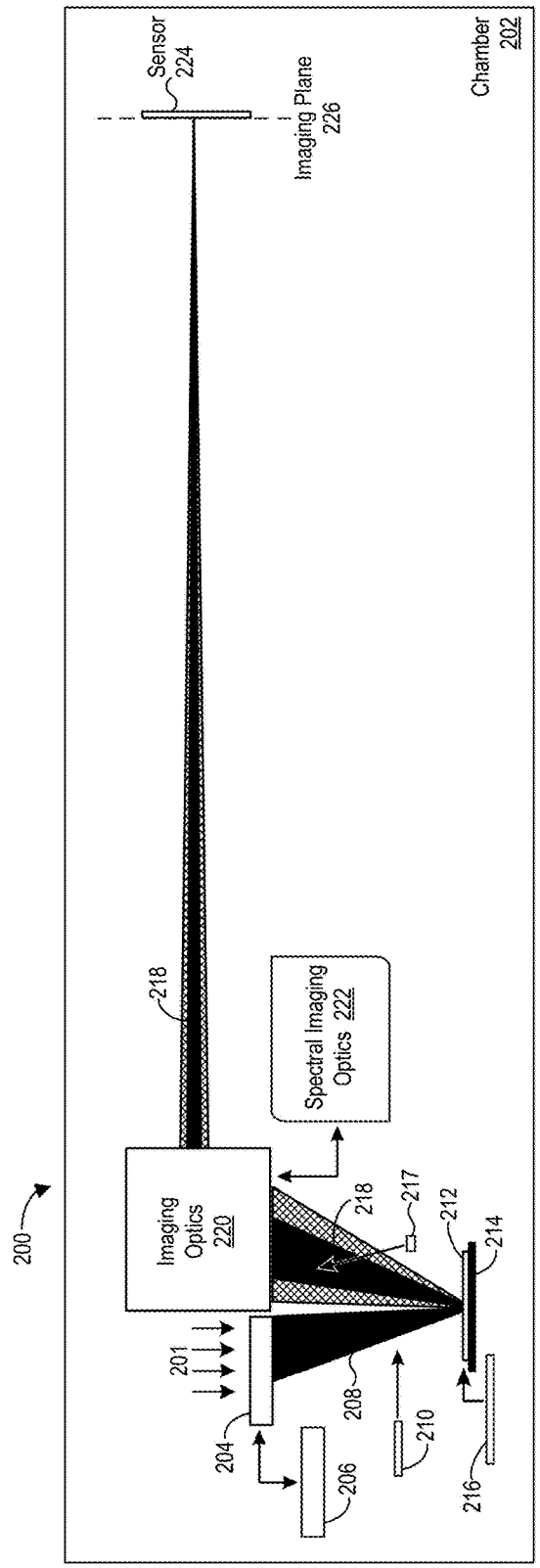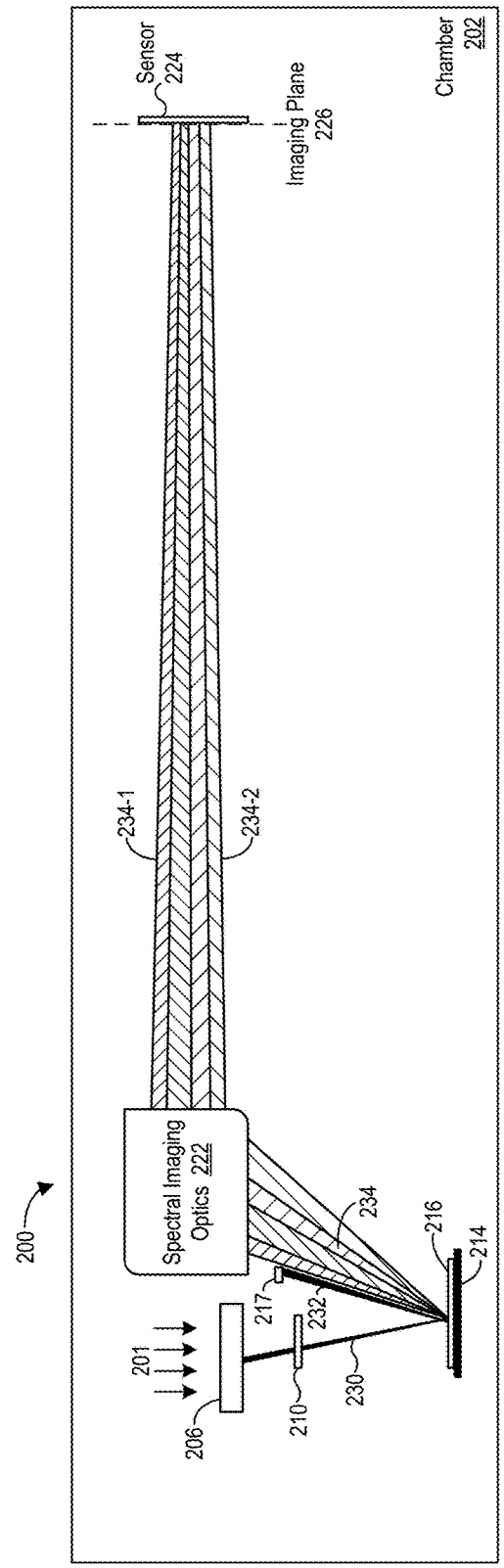
FIG. 2A
FIG. 2B

IN-SITU IN-BAND AND OUT-OF-BAND SPECTRAL MEASUREMENT FOR EUV TOOLS

TECHNICAL FIELD

This disclosure relates to extreme ultraviolet (EUV) tools (e.g., as used in semiconductor manufacturing), such as EUV inspection and imaging tools and EUV scanners, and more specifically to spectral analysis of light in EUV tools.

BACKGROUND

The operating photon wavelength used in EUV tools is 13.5 nm, which is referred to as the actinic wavelength. But generating actinic-wavelength photons, which is typically done using a laser plasma or discharge plasma, also results in plasma light emissions with wavelengths other than 13.5 nm being simultaneously generated and subsequently propagated in the optical system. These other photons include in-band (IB) photons and out-of-band (OOB) photons. These IB photons are EUV photons within the transmission band of the optical train of the system, but have different wavelengths from the 13.5 nm photons. The bulk of the IB photons that survive transmission through the EUV optical train typically fall within +/−2.5% of 13.5 nm, but may have a finite non-negligible spread at the EUV light source spanning approximately 5-20 nm. The OOB photons typically have wavelengths ranging approximately from 50 nm to 1000 nm. The photons between these two bands, with wavelengths ranging approximately from 20 nm to 50 nm, may be generated at the light source but typically cannot propagate through the system because they are not within the transmission band of the optical train.

EUV optical systems use multilayer stack-based EUV reflective optics (i.e., mirrors), which have a narrow spectral response around the actinic wavelength, allowing inherent IB band-pass filtering across the optical path. Propagation across multiple EUV mirrors further narrows this band-pass filter, resulting in further narrowing of the spread of IB photons. As a result of this filtering, the IB photons cause little impact overall on the actinic (monochromatic) image quality at the imaging plane of the EUV tool (e.g., in the sensor plane in an EUV inspection/review system or in the wafer plane of an EUV scanner). The optical design of the EUV tool thus provides intrinsic actinic-wavelength selectivity for IB photons.

The multilayer stack-based EUV reflective optics, however, do not offer strong filtering or attenuation for OOB photons, although they do provide strong filtering for wavelengths under 50 nm. Generation and propagation of OOB light to the imaging plane is thus unavoidable unless the OOB light can be selectively filtered. As a result, for typical EUV tools (e.g., with incoherent plasma-based light sources), substantial OOB light can reach the imaging plane and degrade the actinic image quality. Such EUV tools include actinic patterned mask inspection (APMI) tools that identify and map defects on reticles (i.e., photomasks, which may simply be referred to as masks) used in semiconductor manufacturing, actinic reticle imaging and review systems that provide images (e.g., scanner-matched images) of defects previously identified and mapped by APMI tools, and EUV scanners that project reticle patterns onto semiconductor wafers with EUV light as part of the photolithographic fabrication process.

Multiple factors contribute to the generation and propagation of OOB light in these EUV tools, but in general OOB photons are ubiquitous in most EUV systems. First, the OOB light from an EUV plasma-based light source has non-negligible and high relative spectral content. Depending on the source type, the OOB spectral content can be as much as 85% of the total power from the light source. Second, unlike the narrow band of IB EUV photons, the OOB light has large spectral spread; the OOB spectral band in an EUV tool can be very broad (e.g., approximately from 50 nm to 1000 nm). Third, OOB photons in this broad spectral band are effectively reflected from multilayer-based EUV mirrors, as shown for example in FIG. 1, and therefore reach the imaging plane (e.g., sensor plane or wafer plane) in the EUV tool. FIG. 1 is a graph 100 showing reflectivity from a 40-bilayer EUV mirror as a function of OOB wavelength. Each bilayer is a pair of adjacent layers of molybdenum (Mo) and silicon (Si). The reflectivity provided by this mirror is over 40% for much of the OOB spectral band and is over 60% for some OOB wavelengths. This significant, non-negligible reflectivity of EUV mirrors at OOB wavelengths provides little attenuation of OOB light without additional elements for filtering OOB light in the optical path. While filters are available that can suppress OOB light to provide high spectral purity in the EUV, these filters also result in substantial loss of EUV photons and thus reduce the actinic transmission and consequent tool throughput.

SUMMARY

Accordingly, there is a need for ways to operate an EUV tool in the absence of filters that attenuate OOB light, to avoid the corresponding loss of valuable EUV photons and the resulting reduction in throughput. Such an operational mode that allows both IB and OOB photons within the tool can only be effective if the system is spectrally characterized. This goal may be achieved through in-situ measurement of the OOB light propagating in the optical system. Accurate characterization of the OOB light can, for example, allow EUV inspection and imaging applications that operate in the presence of OOB light to mitigate image artifacts from the OOB light and achieve high throughput. OOB characterization is also useful for system diagnostics, control, and preventive maintenance of optical elements for all types of EUV tools, including EUV scanners as well as actinic inspection or imaging tools.

In some embodiments, a system includes a chamber of an EUV tool and a chuck in the chamber. A substrate is to be mounted on the chuck. The system also includes an illumination aperture in the chamber to provide a beam of light to illuminate the substrate on the chuck. The beam of light includes extreme ultraviolet (EUV) in-band (IB) light and also includes out-of-band (OOB) light. The OOB light has longer wavelengths than the EUV IB light. The system further includes a beam-narrowing aperture in the chamber to selectively narrow the beam of light to illuminate the substrate. The beam-narrowing aperture is switchable into and out of a path for the beam of light. The system additionally includes a band-selection filter to filter out the OOB light or the EUV IB light, imaging optics in the chamber to relay light from the substrate to an imaging plane, a grating to spectrally disperse the light from the substrate; and a sensor to detect the light from the substrate as relayed by the imaging optics and spectrally dispersed by the grating.

In some embodiments, a method is performed in a chamber of an EUV tool. In the method, a beam of light is narrowed using a beam-narrowing aperture. The beam of light includes EUV IB light and OOB light. The OOB light has longer wavelengths than the EUV IB light. Either the OOB light or the EUV IB light is filtered out. A substrate on a chuck is illuminated with the narrowed beam of light. The light from the substrate is spectrally dispersed using a grating and is relayed to an imaging plane. The light from the substrate as relayed by the imaging optics and spectrally dispersed by the grating is detected using a sensor.

BRIEF DESCRIPTION OF THE DRAWINGS

For a better understanding of the various described embodiments, reference should be made to the Detailed Description below, in conjunction with the following drawings. The drawings may not be to scale.

FIG. 2A is a block diagram of an optical system in an EUV inspection or imaging tool configured in a first mode for regular inspection or imaging, in accordance with some embodiments.

FIG. 2B is a block diagram of the optical system of FIG. 2A configured in a second mode for OOB characterization, in accordance with some embodiments.

Like reference numerals refer to corresponding parts throughout the drawings and specification.

DETAILED DESCRIPTION

Figure 1:
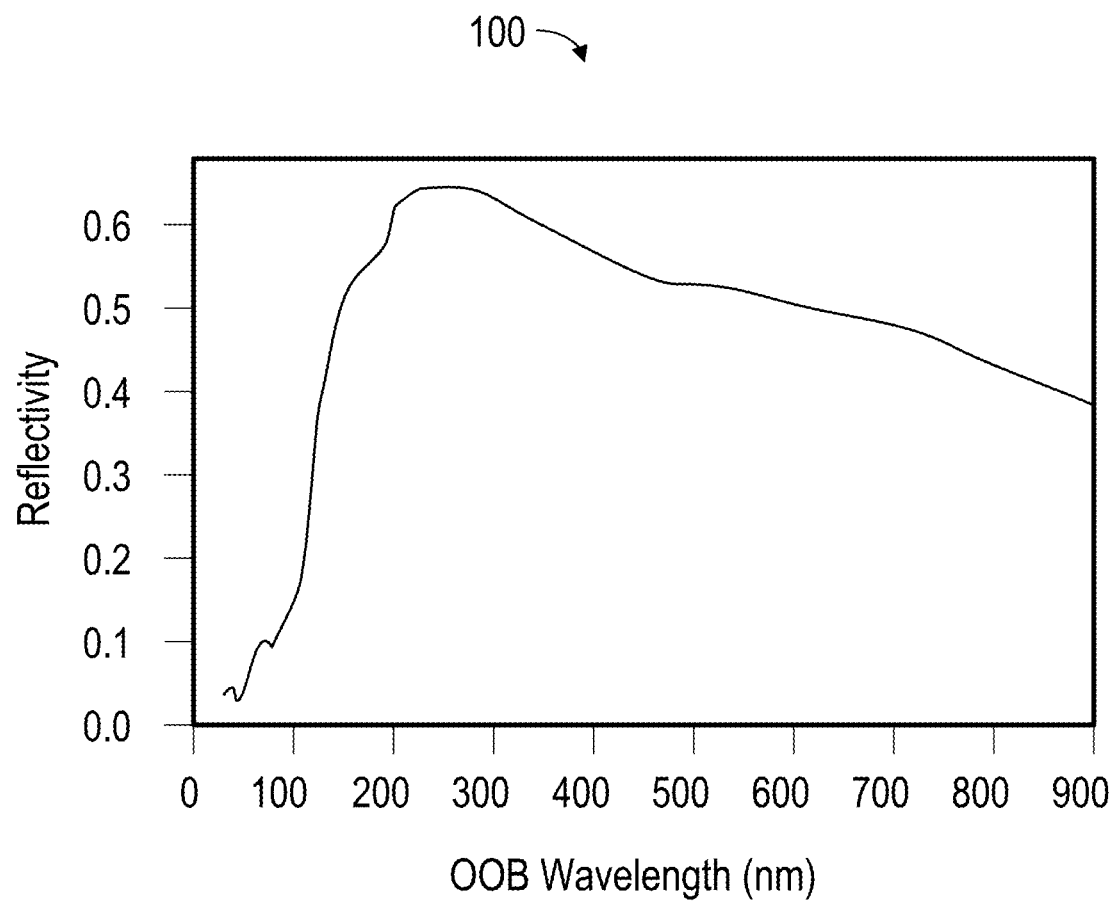
FIG. 1 is a graph showing reflectivity from an EUV mirror as a function of OOB wavelength.

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

A spectral analyzer implemented in an EUV tool (i.e., implemented in situ in the tool) may be used to characterize OOB light in the tool. Accurate characterization of the OOB light can then be used to improve the performance of the EUV tool. Examples of EUV tools in which an in-situ spectral analyzer may be used to characterize OOB light include APMI tools, actinic reticle imaging and review systems, and EUV scanners. In-situ OOB spectral measurements can improve throughput without reducing defect sensitivity in inspection or imaging tools and without impairing printability predictions for scanners.

Imaging applications on APMI systems call for accurate and robust database modelling of the far-field images for reliable defect detection. For EUV APMI systems, forward image modelling from the mask plane to the far-field imaging plane is typically performed assuming spectrally pure EUV light at 13.5 nm. To achieve the added goal of increasing throughput while allowing EUV and OOB photons to propagate in the tool, without significantly degrading the imaging performance, contributions from OOB light should be included in the modelling. OOB photons that are not accounted for in images can cause image artifacts, making die-to-database inspection challenging. But if the OOB spectral content, as it appears at the imaging plane, is well-measured and subsequently incorporated in image calculations, database-modelling errors due to the OOB light can be mitigated and defect-detection fidelity improved. The large range of the OOB band (e.g., ~50 nm to 1000 nm) also results in a large set of incoherent partial aerial images to be considered, with the incoherent partial images being different in terms of image structure and relative photon content. A spectral analyzer within the APMI system may distinguishably measure the OOB photons at various wavelength within the OOB band. In some embodiments, the spectral analyzer is configured to provide OOB spectral characterization at the far-field imaging plane, which is the plane of concern, to ensure spectral matching between the OOB spectral measurements and standard imaging (e.g., production imaging) performed with the APMI system. The spectral analyzer thus may be configured such that light-transmission conditions for the spectral measurements substantially match those for standard imaging (e.g., are mirror-matched). Such a spectral analyzer provides in-situ, spectrally matched OOB characterization that enables high-throughput, high-fidelity reticle inspection.

The presence of OOB photons can also hamper the metrology performance of actinic reticle imaging and review systems. Contributions from OOB photons in the review images can lead to inaccurate measurements of reticle pattern metrics (e.g., critical dimension (CD), normalized intensity log slope (NILS), contrast, etc.). These inaccurate measurements can impair the reliability of printability predictions on a scanner. This problem may be mitigated through suppression of OOB photons with EUV narrow-band spectral-selection filters, but not without reducing system throughput, because the filters substantially reduce the number of EUV photons as well. To reduce the impact on throughput or avoid comprising throughput, accurate OOB modelling can be performed using OOB characterization data, to factor out the OOB effects from the images. This is particularly true when through-focus review images are used to recover the near field of the mask. The metrology errors due to near-field recovery can be reduced (e.g., minimized) by incorporating multiple band-specific OOB kernels in the forward model. Deliberate and accurate inclusion of the effects of OOB light in the forward models will not transfer OOB-induced image errors into the recovered near field, thereby enabling true measurement of the mask. And regardless of whether an imaging system is operated with spectrally pure illumination in a low-throughput operation mode or with substantial OOB content in an increased-throughput mode, in-situ spectrally matched OOB spectral content characterization is a useful diagnostic.

For EUV scanners, a large OOB content, if not suppressed in the optical chain, can degrade the image contrast on the wafer plane. This is particularly true of EUV resists that are based on ArF/KrF resist platforms and particularly important for so-called butted fields, where the fields are printed very close to each other. OOB light can be reflected from a neighboring black-bordered area into critical zones, degrading CD quality. OOB characterization with an in-situ spectral analyzer is therefore useful in EUV scanners as well, because it allows for diagnostics and control.

Further, for all types of EUV tools, in-situ measurement of the OOB spectrum during preventive maintenance allows monitoring of system health. For example, processes such as coating degradation and carbon growth may be monitored through spectral signatures that these processes leave in the OOB band.

FIGS. 2A and 2B are block diagrams of an optical system 200 in an EUV inspection or imaging tool in accordance with some embodiments. For example, the tool may be an APMI tool for mapping defects on production reticles or an actinic reticle imaging and review system for imaging mapped defects on production reticles. The tool is operable in a first mode of operation for regular inspection or imaging (e.g., production inspection or imaging of production reticles) and in a second mode of operation for OOB characterization. In the second mode, the optical system 200 acts as a spectral analyzer. In FIG. 2A, the optical system 200 is configured for the first mode. In FIG. 2B, the optical system 200 is configured for the second mode.

The optical system 200 includes various components situated within a chamber 202 (e.g., a vacuum chamber or a partial-pressure gas-purged chamber). In the first mode of FIG. 2A, a substrate 212 (e.g., a reticle) is mounted on a chuck 214 in the chamber 202. The substrate 212 may be a production substrate (e.g., a production reticle). An illumination aperture 204 in the chamber 202 receives light 201 from an EUV light source (e.g., a plasma-based light source, not shown) and provides light 208 from the EUV light source to the substrate 212, thereby illuminating the substrate 212. The light 208 is a portion of the light 201, as shaped by the illumination aperture 204. The light 201 and 208 includes EUV IB light and also includes OOB light. (The EUV IB light may be considered to include 13.5 nm (i.e., actinic) photons as well as other EUV photons with wavelengths around 13.5 nm). The OOB light has longer wavelengths than the EUV IB light. For example, the OOB light includes wavelengths of approximately 50 nm to 1000 nm. Imaging optics 220 collect light 218 from the illuminated substrate 212 (e.g., light 208 reflected by the substrate 212) and relay the light 218 to an imaging plane 226, where the light 218 is detected by a sensor 224 (e.g., a charge-coupled device (CCD) image sensor) in the imaging plane 226. The sensor 224 generates an image of the detected light 218 that is analyzed to map defects or to image a mapped defect.

In the second mode of FIG. 2B, the substrate 212 is unloaded from the chamber 202 and replaced with a substrate 216 (e.g., a reticle) distinct from the substrate 212. The substrate 216 is loaded into the chamber 202 and mounted on the chuck 214. The substrate 216 is referred to as a characterization substrate 216 (e.g., a characterization reticle) because of its use in the OOB characterization process corresponding to the second mode. The optical system 200 includes a beam-narrowing aperture 206 in the chamber that is switchable into and out of a path for the beam of light from the light source (i.e., into and out of the optical path). In the second mode (FIG. 2B), the beam-narrowing aperture 206 is switched into the optical path, where it narrows the beam of light to a narrowed beam 230 (i.e., a pencil beam). In the first mode (FIG. 2A), the beam-narrowing aperture 206 is switched out of the optical path, such that it does not narrow the beam of light 208. The beam-narrowing aperture 206 thus selectively narrows the beam of light, depending on whether it is switched into and out of the optical path. In some embodiments, the beam-narrowing aperture 206 is on a disk that is rotated to switch the beam-narrowing aperture 206 into and out of the optical path or on a stage that is translated to switch the beam-narrowing aperture 206 into and out of the optical path.

In some embodiments, the beam-narrowing aperture 206 is used in conjunction with the illumination aperture 204 in the second mode: the illumination aperture 204 remains in the beam path to shape the beam of light 201 and the beam-narrowing aperture 206 further narrows the beam to produce the narrowed beam 230. Alternative, the beam-narrowing aperture 206 may be used without the illumination aperture 204 to narrow the beam of light 201: the illumination aperture 204 is switched out of the beam's path in the second mode and switched into the beam's path in the first mode. To perform this switching, the illumination aperture 204 may be situated on a rotatable disk (e.g., the same rotatable disk as the beam-narrowing aperture 206 or a different rotatable disk) or translation stage.

In some embodiments, the beam-narrowing aperture 206 is a slit aperture 206. Alternative, the beam-narrowing aperture 206 has a different shape (e.g., is a pinhole aperture).

The characterization substrate (e.g., characterization reticle) 216 includes a grating (e.g., a line-space grating) to spectrally disperse light 234 from the characterization substrate 216: the grating spectrally disperses the light 230 that is incident on the characterization substrate 216, so that light 234 from the characterization substrate 216 is spectrally dispersed. Spectral imaging optics 222 collect the spectrally dispersed light 234 and relay the light 234 to the imaging plane 226, where the light 234 is detected by the sensor 224. The light 234 as relayed by the spectral imaging optics 222 is far-field light with respect to the characterization substrate 216 and does not include image information for the characterization substrate 216. The sensor 224 generates an image of the detected light 234; this image is analyzed for OOB characterization. The spectral imaging optics 222 replace the imaging optics 220 in the second mode: the spectral imaging optics 222 are switched into the optical path in the second mode and switched out of the optical path in the first mode, whereas the imaging optics 220 are switched into the optical path in the first mode and out of the optical path in the second mode. The spectral imaging optics 222 may be referred to as first imaging optics and the imaging optics 220 may be referred to as second imaging optics (or vice-versa). The sensor 224 is situated in the imaging plane 226 both to image the substrate (e.g., reticle) 212 (FIG. 2A) in the first mode and to detect the light 234 as relayed by the spectral imaging optics 222 and spectrally dispersed by the grating on the characterization substrate 216 (FIG. 2B) in the second mode.

The imaging optics 220 and spectral imaging optics 222 include EUV mirrors (e.g., multilayer stack-based EUV reflective optics, which may have 40 bilayers). In some embodiments, the spectral imaging optics 222 and imaging optics 220 are mirror-matched: the spectral imaging optics 222 have a first plurality of EUV mirrors, the imaging optics 220 have a second plurality of EUV mirrors, the number of EUV mirrors in the first plurality of EUV mirrors equals the number of EUV mirrors in the second plurality of EUV mirrors, and the reflectivity of the first plurality of EUV mirrors substantially equals (e.g., to within manufacturing tolerances) the reflectivity of the second plurality of mirrors. For example, the first plurality of EUV mirrors includes a first set of EUV mirrors and a second set of EUV mirrors, the second plurality of EUV mirrors includes the first set of EUV mirrors and a third set of EUV mirrors, the third set of EUV mirrors has the same number of EUV mirrors as the second set, and the second and third sets of EUV mirrors have substantially equal reflectivity. The third set of EUV mirrors is switchable into a path of light from the characterization substrate 216 in the second mode and out of a path of light from the substrate 212 in the first mode. Mirror matching ensures that the OOB spectrum characterized in the second mode accurately matches the OOB spectrum present during regular operation (e.g., during production) in the first mode.

Figure 3A:
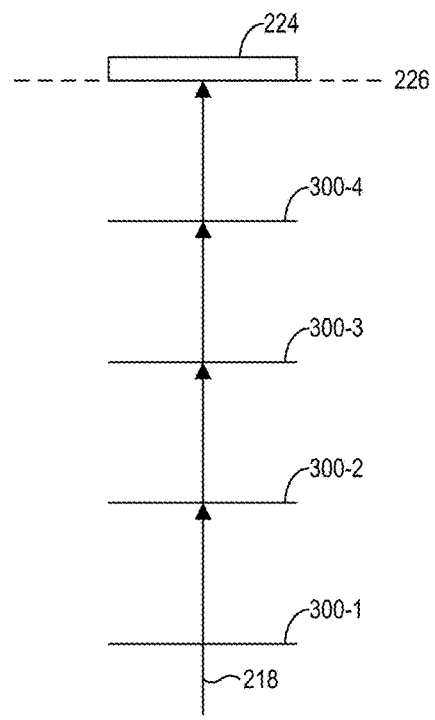
FIGS. 3A and 3B are schematic illustrations of imaging optics in the optical system of FIGS. 2A and 2B in accordance with some embodiments.
Figure 3B:
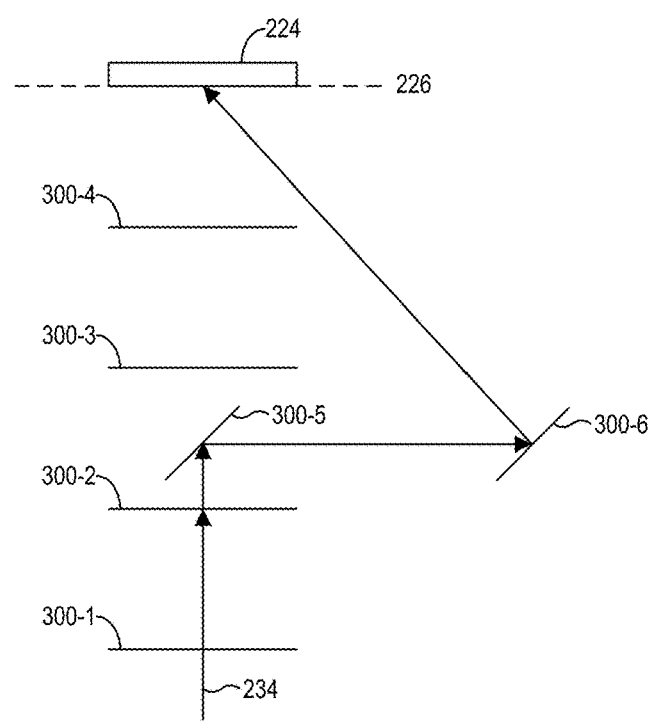

FIGS. 3A and 3B are schematic illustrations of an example of the imaging optics 220 and spectral imaging optics 222 in accordance with some embodiments. In FIG. 3A, which is for the first mode, a first plurality of EUV mirrors 300-1 through 300-4 compose an example of the imaging optics 220 (FIG. 2A). The EUV mirrors 300-1 through 300-4 direct the light 218 (FIG. 2A) to the sensor 224 in the imaging plane 226. For simplicity, the light 218 is shown as being transmitted through the EUV mirrors 300-1 through 300-4. But in practice, the EUV mirrors 300-1 through 300-4 are reflective (i.e., they are mirrors) and reflect the light 218 along respective segments of an optical path that leads to the sensor 224. In FIG. 3B, which is for the second mode, a fifth EUV mirror 300-5 is positioned in the optical path between the second EUV mirror 300-2 and the third EUV mirror 300-3. For example, the fifth EUV mirror 300-5 is mounted on a rotatable and/or translatable stage that allows it to be moved into and out of the optical path, thus making both the fifth EUV mirror 300-5 and a sixth EUV mirror 300-6 switchable into and out of the optical path (i.e., switchable into the path of the light 234 and out of the path of the light 218). The EUV mirror 300-5 directs the light 234 to the sixth EUV mirror 300-6, which directs the light 234 to the sensor 224. The EUV mirrors 300-1, 300-2, 300-5, and 300-6 compose an example of the spectral imaging optics 222 (FIG. 2B). The first and second EUV mirrors 300-1 and 300-2 are an example of the first set of EUV mirrors, the third and fourth EUV mirrors 300-3 and 300-4 are an example of the second set of EUV mirrors, and the fifth and six EUV mirrors 300-5 and 300-6 are an example of the third set of EUV mirrors. The imaging optics 220 and the spectral imaging optics 222 each include the same number of EUV mirrors 300 (e.g., each include four EUV mirrors 300), which may have substantially the same reflectivity and are therefore mirror-matched. Each of the EUV mirrors 300-1 through 300-6 may be multilayer stack-based EUV reflective optics (e.g., with 40 bilayers).

In addition to providing the spectrally dispersed light 234, the grating on the characterization substrate 216 (FIG. 2B) reflects zeroth-order spectrally dispersed light 232, which has high power and intensity. To prevent the high-power zeroth-order light 232 from interfering with OOB characterization, a beam-blocking aperture 217 is positioned in the second mode (FIG. 2B) to block the zeroth-order light 232. By blocking the zeroth-order light 232, the beam-blocking aperture 217 prevents the zeroth-order light from reaching the sensor 224 and saturating it. In some embodiments, the beam-blocking aperture 217 is positioned between the characterization substrate 216 and the spectral imaging optics 222, such that the spectral imaging optics 222 do not collect the zeroth-order light 232 and do not relay the zeroth-order light 232 to the sensor 224. The beam-blocking aperture 217 is switchable into and out of the optical path: the beam-blocking aperture 217 is switched into the optical path in the second mode to block the zeroth-order light 232 and is switched out of the optical path in the first mode so that it does not block any of the light 218. For example, the beam-blocking aperture 217 is on a disk that is rotated to switch the beam-blocking aperture 217 into and out of the optical path.

In some embodiments, the beam-blocking aperture 217 is omitted and the zeroth-order light 232 propagates to the imaging plane 226. The sensor 224 is positioned off-center in the imaging plane 226 to avoid the zeroth-order light (e.g., by analogy to the sensor 442 of FIG. 4B, below).

The wavelengths of the spectrally dispersed light 234 vary from a shortest wavelength for the spectrally dispersed light 234 closest to the zeroth-order light 232 to a longest wavelength for the spectrally dispersed light 234 farthest from the zeroth-order light 232. The spectrally dispersed light 234-1 is the spectrally dispersed light 234 with the shortest wavelength; the spectrally dispersed light 234-2 is the spectrally dispersed light with the longest wavelength. Multiple dispersion orders of spectrally dispersed light 234 are mixed in the spectrally dispersed light 234.

The optical system for a spectral analyzer in the second mode further includes a band-selection filter to filter out the OOB light or the EUV IB light. In the optical system 200, the band-selection filter is a transmissive filter 210 (FIG. 2B) that is switchable into and out of the optical path. The filter 210 is switched into the optical path in the second mode and out of the optical path in the first mode. For example, the filter 210 is switchable into the path for the narrowed beam 230 at a position between the beam-narrowing aperture 206 and the characterization substrate 216, and thus at a position between the beam-narrowing aperture 206 and the chuck 214.

The filter 210 may transmit the EUV IB light and filter out (i.e., have a high extinction coefficient for) the OOB light (e.g., may be a commercially available filter that performs this filtering). Filtering out OOB light results in IB-only dispersion for the spectrally dispersed light 234: the OOB light is substantially absent from the spectrally dispersed light 234. The resulting IB-only spectrum may be subtracted from a combined IB and OOB spectrum to recover the OOB-only spectrum. Alternatively, an IB-only image is subtracted from a combined IB and OOB image to produce an OOB-only image from which the OOB-only spectrum is recovered. The combined IB and OOB spectrum may be characterized by operating the optical system 200 in the second mode but with the filter 210 switched out of the optical path. The filter 210 thus may be either switched into or out of the optical path in the second mode, depending on the spectrum being characterized. Measuring the OOB-only spectrum in this way is referred to as a differential measurement.

Alternatively, the filter 210 may transmit the OOB light and filter out (i.e., have a high extinction coefficient for) the EUV IB light. For example, the filter 210 may be a glass filter of sufficient thickness to extinguish the EUV IB light. Such filters are commercially available with various OOB pass bands. This thickness is typically greater than the thickness of a filter 210 that filters out OOB, which may be a thin-film filter. Using such a filter allows for direct characterization of the OOB-only spectrum in the second mode without differential measurement.

In other embodiments, the filter 210 is absent from the optical system 200. The band-selection filter is instead implemented (i.e., included) on the characterization substrate 216 along with the grating. The band-selection filter on the characterization substrate 216 may reflect the OOB light and filter out (i.e., have a high extinction coefficient for) the EUV IB light. Filtering out the EUV IB light results in OOB-only dispersion for the spectrally dispersed light 234: the EUV IB light is substantially absent from the spectrally dispersed light 234, allowing the resulting OOB-only spectrum to be directly characterized in the second mode.

Figure 4A:
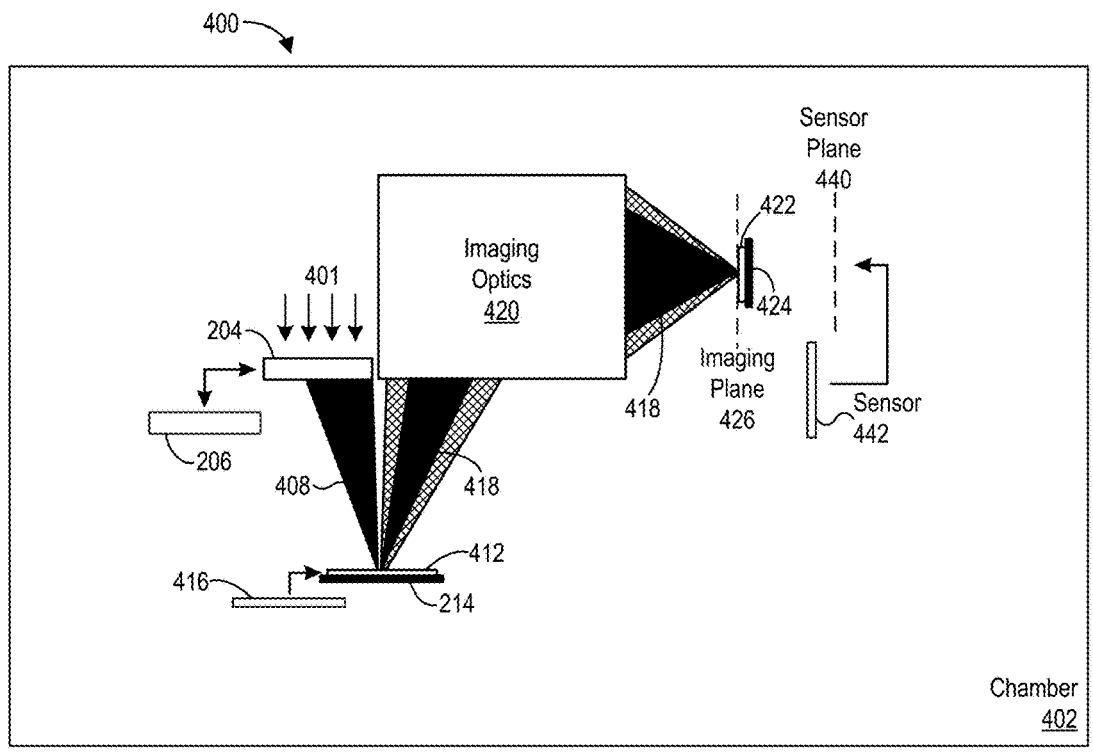
FIGS. 4A and 4B are block diagrams of an optical system in an EUV scanner in accordance with some embodiments.
Figure 4B:
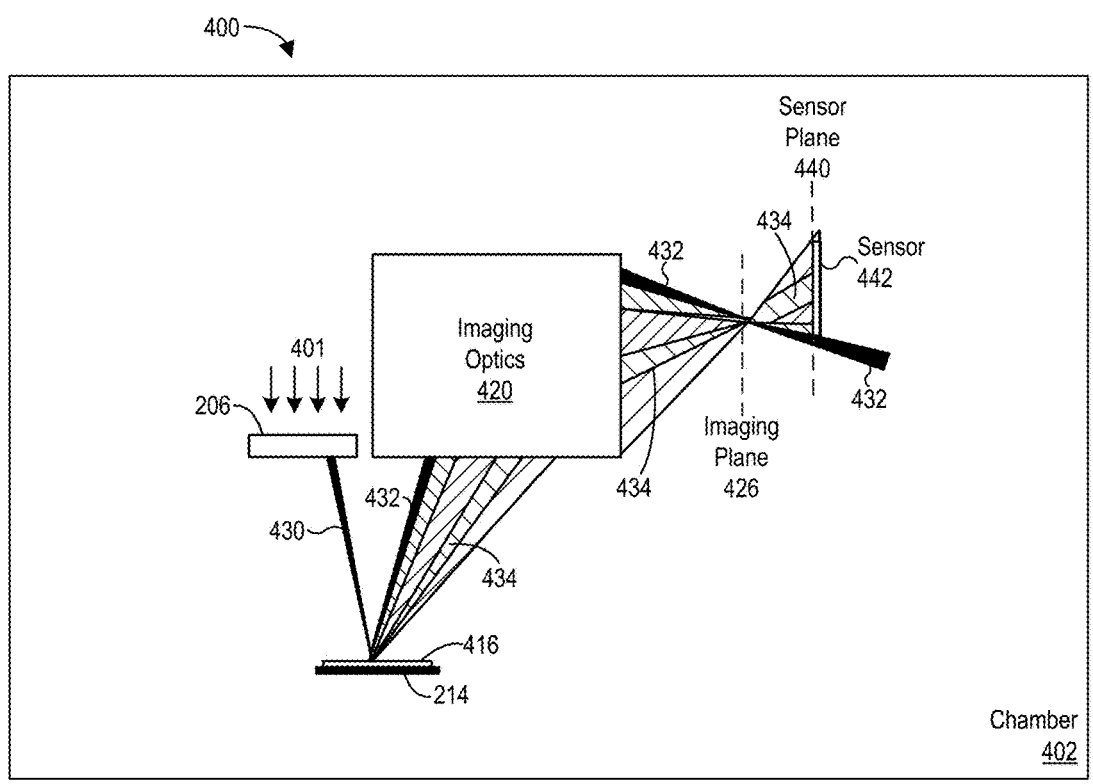

FIGS. 4A and 4B are block diagrams of an optical system 400 in an EUV scanner in accordance with some embodiments. The EUV scanner is operable in a first mode of operation for regular photolithographic exposure (e.g., production exposure using production reticles) and in a second mode of operation for OOB characterization. In the second mode, the optical system 400 acts as a spectral analyzer. In FIG. 4A, the optical system 400 is configured for the first mode. In FIG. 4B, the optical system 400 is configured for the second mode.

The optical system 400 includes various components situated within a chamber 402 (e.g., a vacuum chamber or a partial-pressure gas-purged chamber). These components include an illumination aperture 204, a beam-narrowing aperture 206, and a chuck 214, positioned and configurable as in the optical system 200 (FIGS. 2A-2B). The chuck 214 is a first chuck. In the first mode of FIG. 4A, a substrate 412 (e.g., a production substrate) is mounted on the first chuck 214. The substrate 412 is a reticle (e.g., a production reticle). The illumination aperture 204 receives light 401 from an EUV light source (e.g., a plasma-based light source, not shown) and provides light 408 from the EUV light source to the reticle 412, thereby illuminating the reticle 412. The light 408 is a portion of the light 401, as shaped by the illumination aperture 204. Because the optical system 400 is part of an EUV scanner, as opposed to an EUV inspection or imaging tool, the light 401 is more intense than the light 201 (FIGS. 2A-2B). Similarly, the light 408 is more intense than the light 208 (FIGS. 2A-2B). Like the light 201 and 208, the light 401 and 408 includes EUV IB light and OOB light. The OOB light has longer wavelengths than the EUV IB light. For example, the OOB light includes wavelengths of approximately 50 nm to 1000 nm.

The components of the optical system 400 within the chamber 402 further include imaging optics 420 and a second chuck 424 on which a semiconductor wafer 422 (e.g., a production wafer) may be mounted in the first mode. In the first mode of FIG. 4A, the imaging optics 420 collect light 418 from the illuminated reticle 412 and relay the light 418 to an imaging plane 426. The light 418 is light 408 reflected by the reticle 412. The second chuck 424 holds the wafer 422 in the imaging plane 426. The light 418 exposes the wafer 422 in the imaging plane 426. The EUV scanner with the optical system 400 thus photolithographically exposes the wafer 422 using the light 418 from the reticle 412 in the first mode.

In the second mode of FIG. 4B, the reticle 412 is unloaded from the chamber 402 and replaced with a reticle 416, which is a substrate distinct from the reticle 412. The reticle 416 is loaded into the chamber 402 and mounted on the chuck 214. The reticle 416 is referred to as a characterization reticle 416 because of its use in the OOB characterization process corresponding to the second mode. The beam-narrowing aperture 206 is switched into the optical path (as described for FIGS. 2A and 2B), where it narrows the beam of light to a narrowed beam 430. The beam-narrowing aperture 206 may be used in the second mode in conjunction with the illumination aperture 204 or without the illumination aperture 204, as described for the optical system 200 (FIGS. 2A-2B).

The characterization reticle 416 includes a grating (e.g., a line-space grating) to spectrally disperse light 434 from the characterization reticle 416 (i.e., to spectrally disperse the light 430 that is incident on the characterization reticle 416, so that the light 434 from the characterization reticle 416 is spectrally dispersed). The imaging optics 420 collect the spectrally dispersed light 434 and zeroth-order beam 432, and relay the light 434 and zeroth-order beam 432 to the imaging plane 426 and beyond it to a sensor plane 440. In FIG. 4A, the sensor plane 440 is positioned in the far field of the wafer 422. In FIG. 4B, for the second mode, the wafer 422 has been withdrawn; the chuck 424 may also have been withdrawn or alternatively may have an open area through which the light 434 and zeroth-order beam 432 are transmitted without the chuck 424 being withdrawn. The light 434 as relayed by the imaging optics 420 is far-field light with respect to the characterization reticle 416 and does not include image information for the characterization reticle 416. The sensor plane 440 is beyond the imaging plane 426, with the imaging plane 426 being situated between the imaging optics 420 and the sensor plane 440 along the optical path. The imaging optics 420 used in the second mode of FIG. 4B are the same imaging optics 420 used in the first mode of FIG. 4A. The imaging optics 420 include EUV mirrors (e.g., multilayer stack-based EUV reflective optics, which may have 40 bilayers). The wavelengths of the spectrally dispersed light 434 vary from a shortest wavelength for the spectrally dispersed light 434 closest to the zeroth-order light 432 to a longest wavelength for the spectrally dispersed light 434 farthest from the zeroth-order light 432. Multiple dispersion orders of spectrally dispersed light 434 are mixed in the spectrally dispersed light 434.

In the second mode, the light 434 is detected by a sensor 442 (e.g., a charge-coupled device (CCD) image sensor) situated in the sensor plane 440. The sensor 442 is offset in the sensor plane 440 with respect to the line of sight from the imaging optics 420 so that the intense zeroth-order beam 432 avoids the sensor 442 and does not saturate the sensor 442. Alternatively, a switchable beam-blocking aperture analogous to the beam-blocking aperture 217 (FIGS. 2A-2B) may be used to block the zeroth-order beam 432. The sensor 442 generates an image of the detected light 434; this image is analyzed for OOB characterization. The sensor 442 may be moved out of the sensor plane 440 in the first mode. For example, the sensor 442 may be attached to a translation stage that moves the sensor 442 into the sensor plane 440 in the second mode and out of the sensor plane 440 in the first mode. The sensor 442 is disposed in the chamber 402, such that it is configured to be moved into and out of the sensor plane 440 while remaining in the chamber 402.

The characterization reticle 416 also serves as a reflective band-selection filter to filter out (i.e., have a high extinction coefficient for) the EUV IB light, while the OOB light is dispersed. Accordingly, the light 434 is substantially only OOB and therefore has an OOB-only spectrum. This OOB-only spectrum is characterized in the second mode of the optical system 400.

Figure 5A:
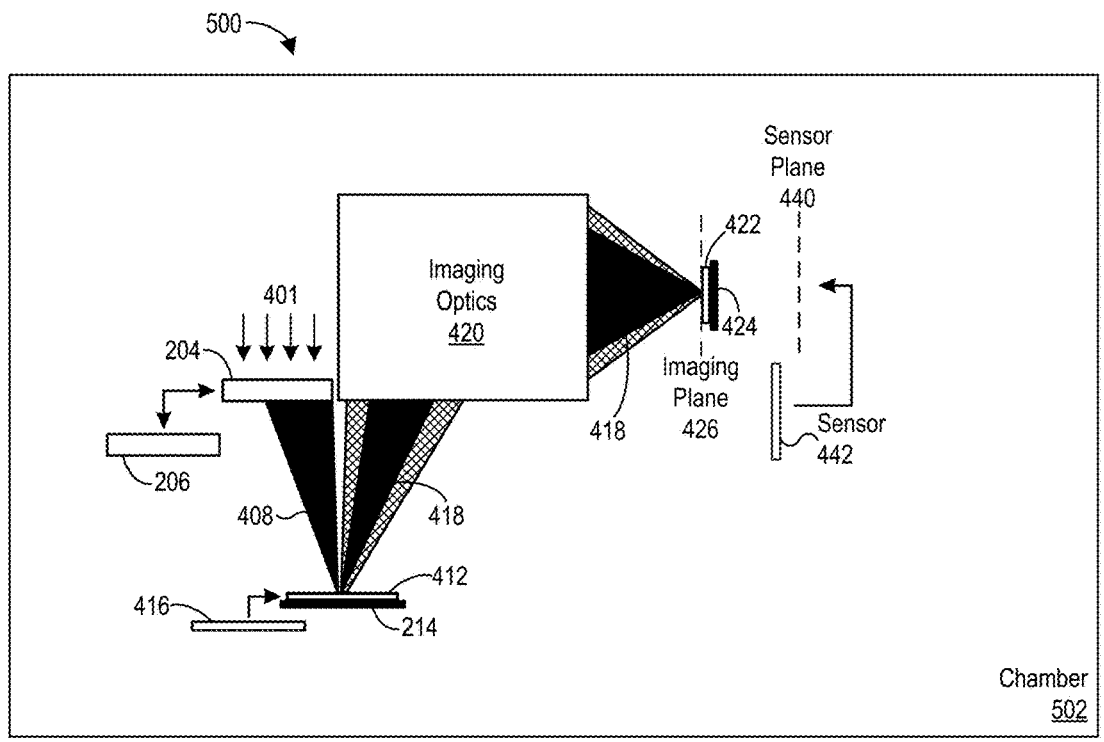
FIGS. 5A and 5B are block diagrams of an optical system in an EUV scanner that is an alternative to the optical system of FIGS. 4A and 4B, in accordance with some embodiments.
Figure 5B:
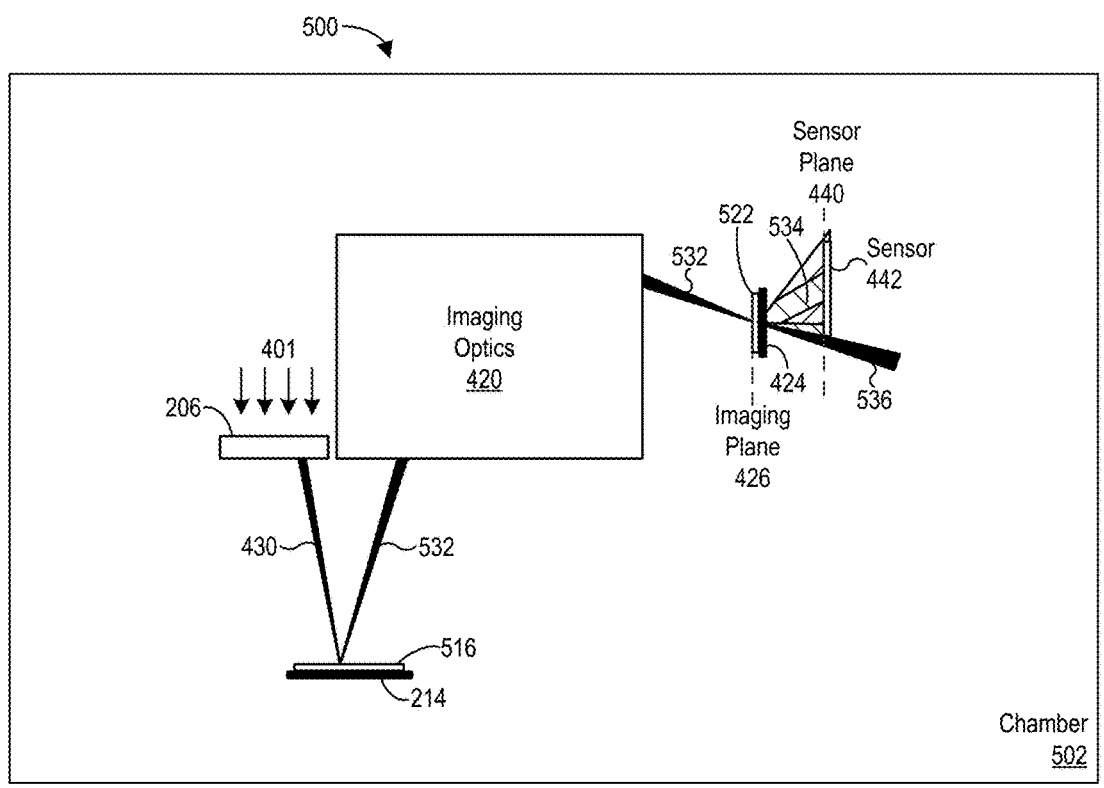

FIGS. 5A and 5B are block diagrams of an optical system 500 in an EUV scanner in accordance with some embodiments. The optical system 500, which is an alternative to the optical system 400 (FIGS. 4A-4B), includes components situated within a chamber 502 (e.g., a vacuum chamber or a partial-pressure gas-purged chamber). The EUV scanner with the optical system 500 is operable in a first mode of operation for regular photolithographic exposure (e.g., production exposure of production reticles) and in a second mode of operation for OOB characterization. In the second mode, the optical system 500 acts as a spectral analyzer. In FIG. 5A, the optical system 500 is configured for the first mode. As configured for the first mode, the optical system 500 is identical to the optical system 400 (FIG. 4A). In FIG. 5B, the optical system 500 is configured for the second mode.

In the second mode of FIG. 5B, the reticle 412 is unloaded from the chamber 502 and replaced with a reticle 516, which is a substrate distinct from the reticle 412. The reticle 516 is loaded into the chamber 502 and mounted on the chuck 214. The reticle 516 is referred to as a characterization reticle 516 because of its use in the OOB characterization process corresponding to the second mode. The beam-narrowing aperture 206 is switched into the optical path (as described for FIGS. 2A and 2B), where it narrows the beam of light to the narrowed beam 430. The beam-narrowing aperture 206 may be used in the second mode in conjunction with the illumination aperture 204 or without the illumination aperture 204, as described for the optical system 200 (FIGS. 2A-2B).

Unlike the characterization reticle 416 in the optical system 400 (FIG. 4B), the characterization reticle 516 does not include a grating and does not spectrally disperse the light 430. The characterization reticle 516 instead reflects some of the light 430 as a narrow beam of light 532 (i.e., a pencil beam). The imaging optics 420 collect the light 532 and relay the light 532 to the imaging plane 426, where the light 532 is incident on a semiconductor wafer 522. The wafer 522 is distinct from the production wafer 422 and is referred to as a characterization wafer 522 because of its use in the OOB characterization process corresponding to the second mode. The characterization wafer 522 replaces the production wafer 422 in the second mode: the production wafer 422 is unloaded from the chamber 502 and the characterization wafer 522 is loaded into the chamber 502, where it is positioned in the imaging plane 426 in the path of the light 532 as relayed by the imaging optics 420. The characterization wafer 522 includes a transmissive grating (e.g., a line-space grating) that spectrally disperses the light 532, generating spectrally dispersed light 534 and zeroth-order light 536. For example, the characterization wafer 522 has a hole in it and the transmissive grating is mounted (e.g., bonded) over the hole, such that the spectrally dispersed light 534 passes through the hole. The second chuck 424 may also have hole in it (e.g., in its center) through which the spectrally dispersed light 534 passes. The zeroth-order light 536 may also pass through the holes in the characterization wafer 522 and the second chuck 424. The wavelengths of the spectrally dispersed light 534 (not including the zeroth-order light 536) vary from a shortest wavelength for the spectrally dispersed light 534 closest to the zeroth-order light 536 to a longest wavelength for the spectrally dispersed light 534 farthest from the zeroth-order light 536. Multiple dispersion orders of spectrally dispersed light 534 are mixed in the spectrally dispersed light 534. In some embodiments, the characterization wafer 522 includes multiple transmissive gratings (e.g., with distinct pitches) that may be successively positioned to be illuminated by the light 532.

In the second mode, the spectrally dispersed light 534 is detected by the sensor 442, as situated in the sensor plane 440. As in the optical system 400 in the second mode (FIG. 4B), the sensor 442 is offset in the sensor plane 440 with respect to the line of sight from the imaging optics 420 so that the intense zeroth-order beam of light 536 avoids the sensor 442. Alternatively, a switchable beam-blocking aperture analogous to the beam-blocking aperture 217 (FIGS. 2A-2B) may be used to block the zeroth-order beam 432. The sensor 442 generates an image of the detected light 534; this image is analyzed for OOB characterization. Also as in the optical system 400, the sensor 442 may be moved out of the sensor plane 440 in the first mode.

While the characterization reticle 516 does not include a grating, it does include a reflective band-selection filter to reflect the OOB light and filter out (i.e., have a high extinction coefficient for) the EUV IB light. Accordingly, the reflected beam of light 532, spectrally dispersed light 534, and zeroth-order light 536 are substantially only OOB. The spectrally dispersed light 534 therefore has an OOB-only spectrum. This OOB-only spectrum is characterized in the second mode of the optical system 500.

Attention is now directed to various components of the optical systems 200 (FIGS. 2A-2B), 300 (FIGS. 3A-3B), and/or 400 (FIGS. 4A-4B).

Figure 6:
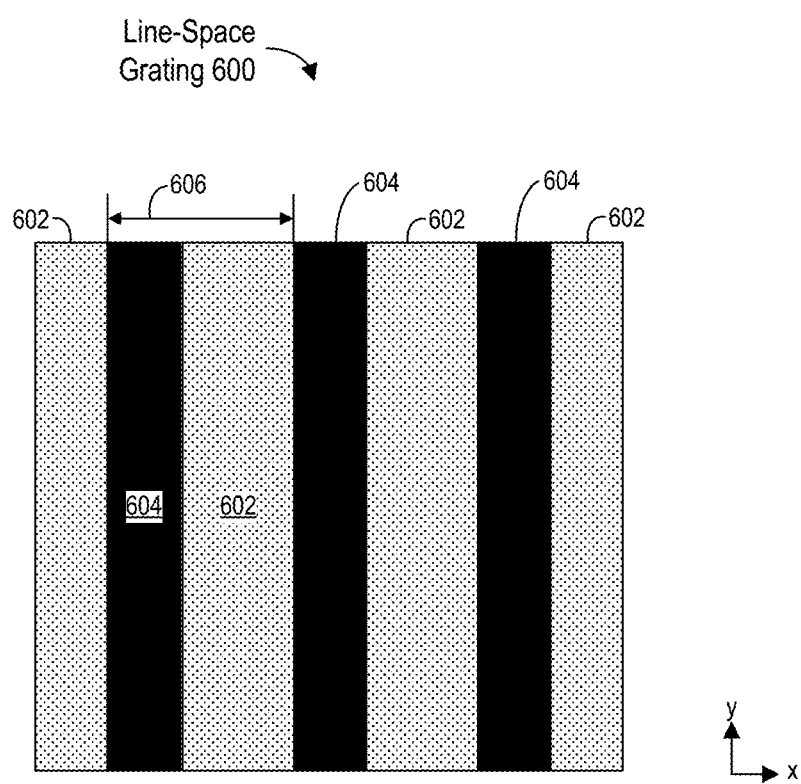
FIG. 6 is a plan view of a line-space grating in accordance with some embodiments.

FIG. 6 is a plan view of a line-space grating 600 in accordance with some embodiments. The line-space grating 600 may be implemented on a substrate (e.g., reticle), such as the characterization substrate 216 (FIG. 2B) or characterization reticle 416 (FIG. 4B), or on a wafer, such as the characterization wafer 522 (FIG. 5B), to spectrally disperse light. The line-space grating 600 includes an alternating series of lines 604 and spaces 602. The spacing between successive lines 604 or spaces 602 (e.g., from the beginning edge of a line 604 or space 602 to the beginning edge of the next line 604 or space 602) is the grating pitch 606. For a line-space grating 600 configured to disperse OOB light on a reticle, the pitch 606 may be on the order of 1 μm. For a line-space grating 600 configured to disperse EUV IB light on a reticle, the pitch 606 may be on the order of 100 nm. For a line-space grating 600 on a wafer (e.g., characterization wafer 522, FIG. 5B), the pitch 606 may be smaller (e.g., four times smaller), due to the demagnification provided by the EUV scanner. In some embodiments, the beam-narrowing aperture 206 (FIGS. 2A-2B, 4A-4B, 5A-5B) is a slit aperture and the direction of the line-space grating 600 is aligned with the slit in the slit aperture to minimize order mixing (i.e., overlap of different dispersion orders) and spatial spread of the spectrally dispersed light.

When the optical system 200 includes the band-selection filter 210, with the band-selection filter 210 being a transmissive filter that transmits EUV IB light and filters out OOB light, the grating 600 may be configured to disperse both IB and OOB light with a pitch 606 that is high enough to disperse OOB light. This grating 600 produces an IB-only spectrum when the filter 210 is switched into the optical path and a combined IB and OOB spectrum when the filter 210 is switched out of the optical path. The IB-only spectrum may be subtracted from the combined IB and OOB spectrum to recover the OOB-only spectrum. Alternatively, an IB-only image is subtracted from a combined IB and OOB image to produce an OOB-only image from which the OOB-only spectrum is recovered. In some embodiments, this grating is implemented as an EUV reticle with alternating absorber and reflective multi-layer-stack regions.

Figure 7:
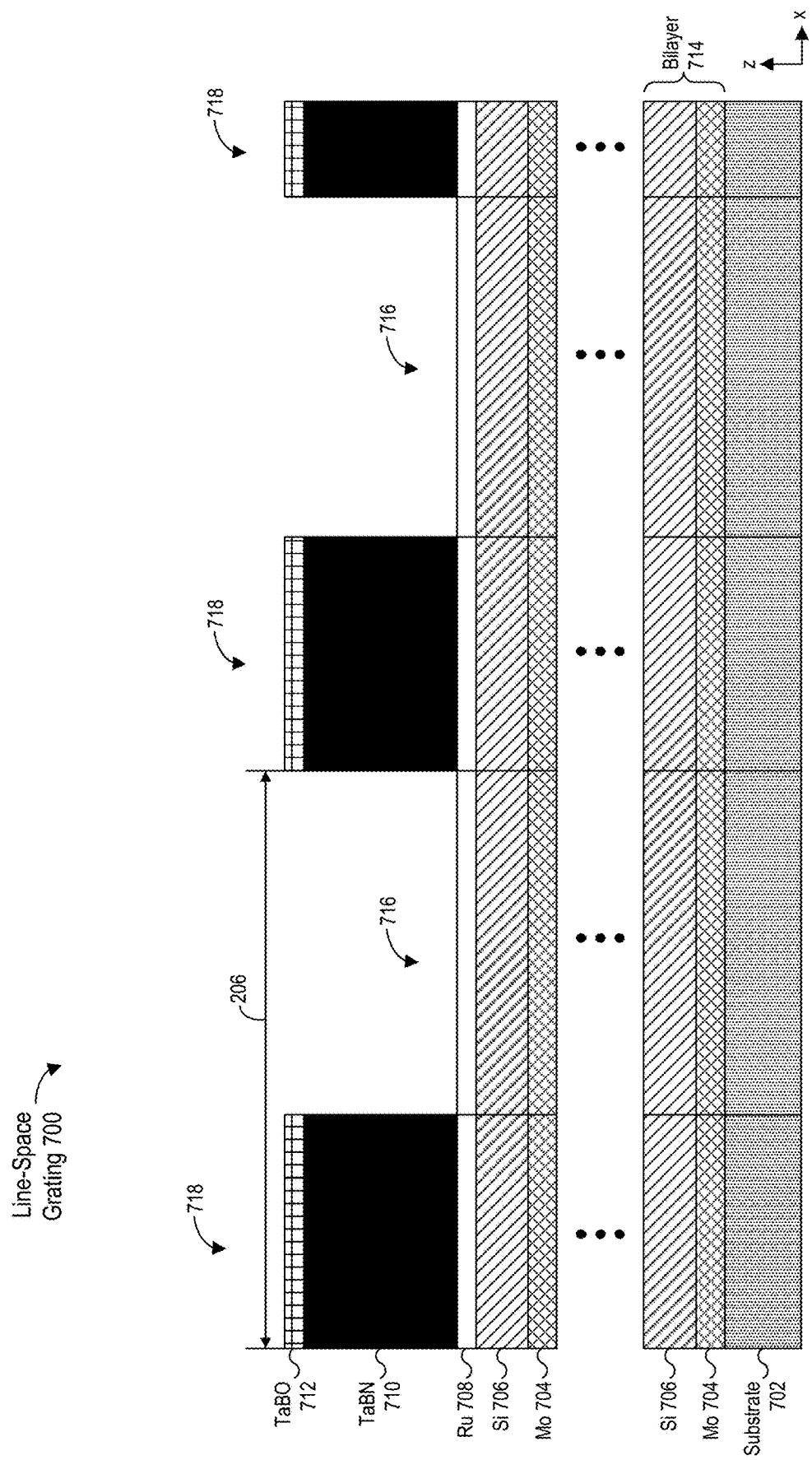
FIG. 7 is a cross-sectional view of an example of the grating of FIG. 6 implemented as an EUV reticle with alternating absorber regions and reflective multi-layer-stack regions in accordance with some embodiments.

FIG. 7 is a cross-sectional view of a line-space grating 700 implemented as an EUV reticle with alternating absorber regions and reflective multi-layer-stack regions in accordance with some embodiments. The line-space grating 700 is an example of the grating 600 (FIG. 6) and may be an example of the characterization substrate 216 (FIG. 2B). The line-space grating 700 includes alternating EUV-reflective multi-layer coatings 716 and EUV-absorber lines 718 with a grating pitch 206. The EUV-reflective multi-layer coatings 716 and EUV-absorber lines 718 are examples of the spaces 602 and lines 604 (FIG. 6), respectively. The EUV-reflective multi-layer coatings 716 (effectively a single multi-layer coating divided into different EUV-reflective regions by the EUV-absorber lines 718) include alternating layers of molybdenum (Mo) 704 and silicon (Si) 706 above a substrate 702 (e.g., quartz), with a capping layer 708 covering the alternating layers of Mo 704 and Si 706. The capping layer 708 may be ruthenium (Ru) or boron (B). Each pair of adjacent Mo 704 and Si 706 layers is called a MoSi bilayer 714. In some embodiments, the Mo layer 704 thickness is 2.8 nm, the Si layer 706 thickness is 4.2 nm, and the capping layer 708 thickness is 2.5 nm. (Thicknesses are in the z-direction in FIG. 7.) The EUV-reflective multi-layer coatings 716 are partially but not perfectly reflecting for EUV light. The EUV-absorber lines 718 are situated above the multi-layer coating 716. The EUV-absorber lines 718 include a tantalum boron nitride (TaBN) layer 710 above the capping layer 708 and a tantalum boron oxide (TaBO) capping layer 712 above the TaBN layer 710. In some embodiments, the TaBO capping layer 712 has a thickness of 2 nm. TaBN is a strongly EUV-absorbing material. The thickness of the TaBN layer 710 is variable and is chosen to absorb substantially all incident EUV light. In some embodiments, the TaBN layer 710 has a thickness of 50-70 nm.

Figure 8:
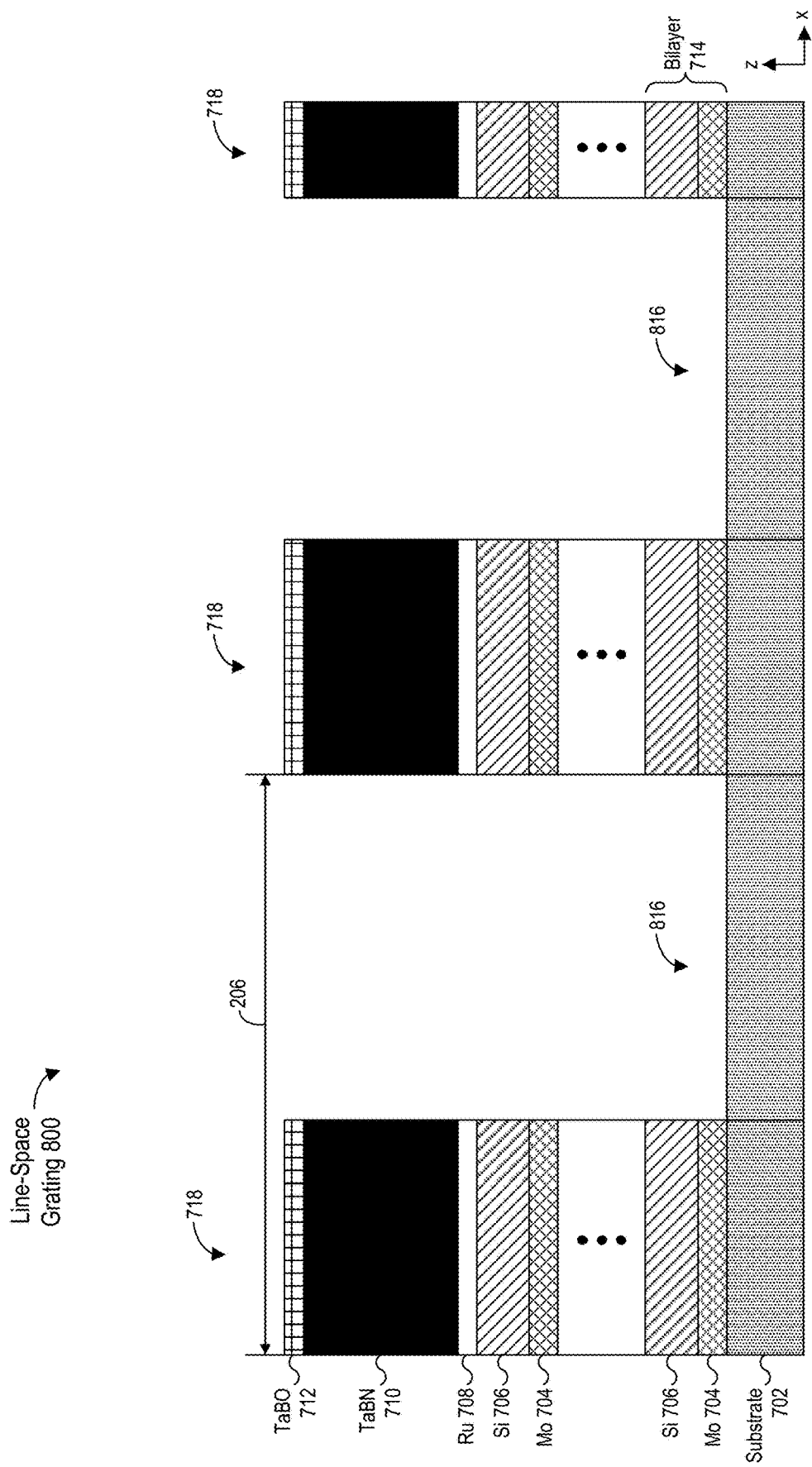
FIG. 8 is a cross-sectional view of an example of the grating of FIG. 6 implemented as a line-space grating on an EUV reticle with EUV-absorber lines alternating with quartz spaces, wherein the quartz spaces are regions of a quartz substrate of the EUV reticle, in accordance with some embodiments.

When the band-selection filter 210 is absent from the optical system 200, the characterization substrate 216 is both a grating and a reflective band-selection filter that reflects OOB light and filters out EUV IB light. This example of the characterization substrate 216 generates an OOB-only spectrum. Such a characterization substrate 216 may be achieved by formatting a line-space grating pattern on a reticle that is non-reflective at IB wavelengths. For example, this characterization substrate 216 may be a patterned chrome-on-glass (COG) substrate, with the spaces being glass and the lines being chrome lines above the glass. Or this characterization substrate 216 may be a line-space grating 800 implemented on an EUV reticle with EUV-absorber lines 718 alternating with quartz spaces 816, as shown in FIG. 8 in accordance with some embodiments. FIG. 8 is a cross-sectional view of this reticle. The quartz spaces 816 are regions of the substrate 702, which is quartz. The alternating EUV-absorber lines 818 (with multi-layer stacks underneath) and quartz spaces 816 are respective examples of the lines 604 and spaces 602 (FIG. 6). The EUV-absorber lines 818 include a tantalum boron nitride (TaBN) layer 810 and a tantalum boron oxide (TaBO) capping layer 812 above the TaBN layer 810, on top of MoSi bilayers 714 (e.g., 40 MoSi bilayers 714) and a capping layer 708. The layers 810 and 812 have similar dimensions to the layers 710 and 712 (FIG. 7). The quartz spaces 816, which may be referred to as black borders, are fabricated by etching away EUV absorber regions and multi-layer stacks underneath those regions to expose parts of the underlying substrate 702.

For an EUV scanner with the optical system 400 (FIGS. 4A-4B), the characterization reticle 416 (FIG. 4B) may be a patterned non-EUV reticle. For example, the characterization reticle 416 may be a patterned COG reticle, with the spaces being glass and the lines being chrome lines above the glass. Alternatively, the characterization reticle 416 may be a line-space grating 800 (FIG. 8) implemented on an EUV reticle. The line-space grating 800 is effective in this context because the EUV-absorber lines 818 have higher reflectivity than the black borders for OOB light, resulting in an OOB grating with high diffraction efficiency. Regardless of the particular implementation, the characterization reticle 416 is both a grating and a band-selection filter that filters out EUV light while spectrally dispersing OOB light.

The optical system 400 may also be used to characterize a combined IB and OOB spectrum, by replacing the characterization reticle 416 with a characterization reticle that spectrally disperses both IB and OOB light. For example, an EUV reticle with the line-space grating 700 (FIG. 7) may be used for such a characterization reticle.

For an EUV scanner with the optical system 500 (FIGS. 5A-5B), the characterization reticle 516 (FIG. 5B) may be an unpatterned non-EUV reticle (e.g., a chrome blank) that reflects OOB light but substantially absorbs EUV light. For example, the characterization reticle 516 may be a COG mask with a blank chrome area or may be a blank quartz substrate. The blank areas on such masks provide specular reflection of the OOB light while reflecting a negligible amount of EUV light. While the characterization reticle 516 is a band-selection filter, it does not include a grating. The optical system 500 instead includes a separate grating on the characterization wafer 522 (FIG. 5B).

In some embodiments, the sensor 224 (FIGS. 2A-2B, 3A-3B) and/or the sensor 442 (FIGS. 4A-4B, 5A-5B) is a time delay integration (TDI) sensor. The TDI sensor may operate in a TDI mode in which it is clocked or may operate in a frame mode without clocking. For the TDI mode, unlike traditional TDI in which the substrate being imaged moves in phase with a TDI clock, the grating that provides spectral dispersion (e.g., line-space grating 600, FIG. 6) (e.g., on the characterization substrate 216, FIG. 2B; the characterization reticle 416, FIG. 4B; or the characterization wafer 522, FIG. 5B) may remain stationary. In these embodiments, the beam-narrowing aperture 206 may be a slit aperture. The grating remains stationary because spectral dispersion is inherently one-dimensional, with the image extension in the other dimension determined by the length of the slit in the slit aperture used to garner photons by clocking the TDI in that direction, allowing better signal-to-noise ratio and improved throughput.

Figure 9:
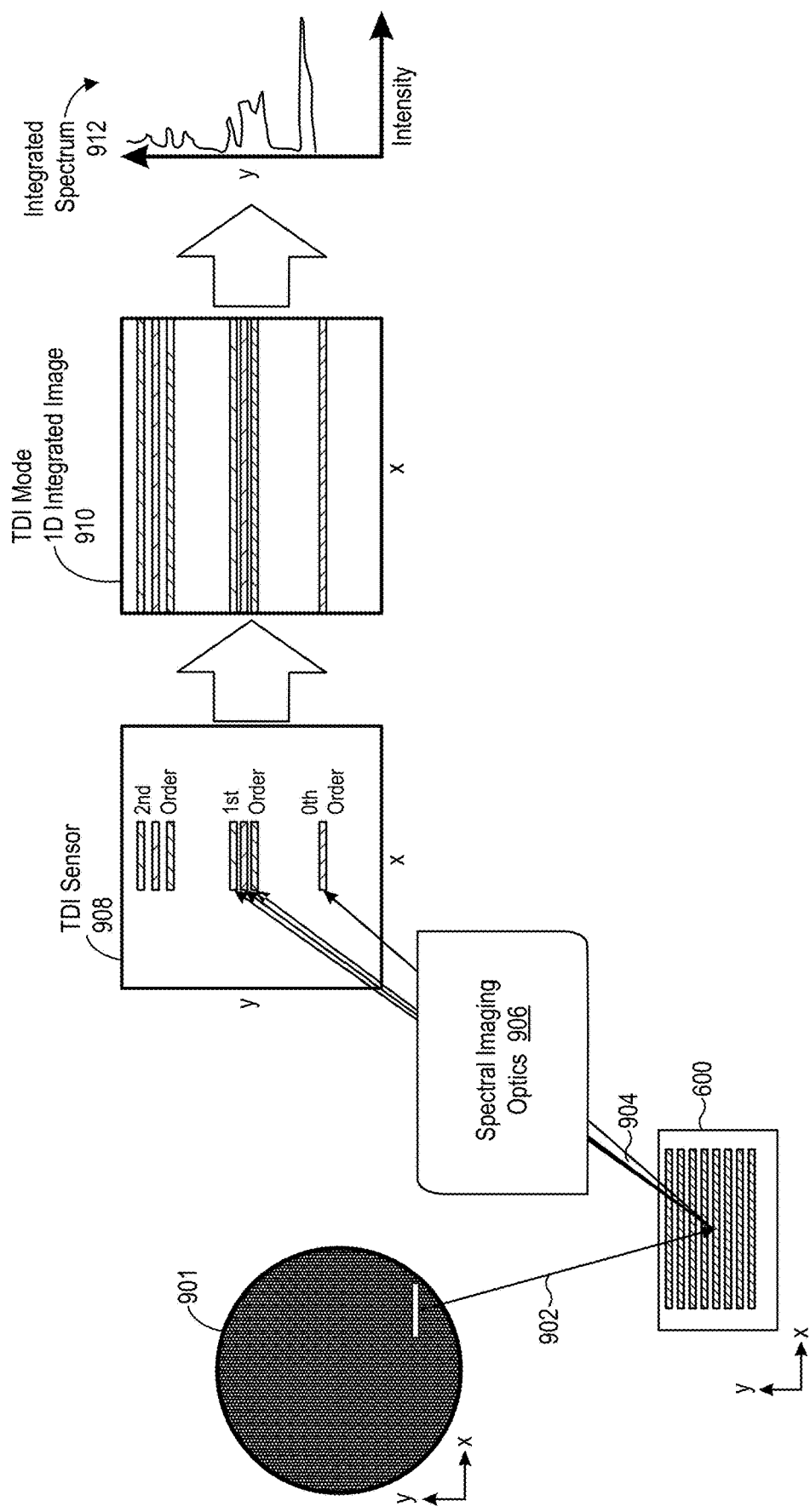
FIG. 9 illustrates TDI imaging of spectrally dispersed light in accordance with some embodiments.

FIG. 9 illustrates TDI imaging of the spectrally dispersed light in accordance with some embodiments. A slit aperture 901, which is an example of the beam-narrowing aperture 206, provides a pencil beam of light 902 (e.g., light 230, FIG. 2B; light 430, FIG. 4B) to the line-space grating 600, which spectrally disperses the light, thus producing spectrally dispersed light 904 (e.g., light 234, FIG. 2B; light 434, FIG. 4B). Spectral imaging optics 906 (e.g., spectral imaging optics 222, FIG. 2B; imaging optics 420, FIGS. 4A-4B) collect the spectrally dispersed light 904 and relay the spectrally dispersed light 904 to a TDI sensor 908 (e.g., sensor 224 or 442). (Different fill patterns in FIG. 9 represent different wavelength sub-bands, such as different colors, with shorter wavelengths being dispersed less for each dispersion order.) Alternatively, the light may be spectrally dispersed by the grating 600 after being relayed by the spectral imaging optics 906, as shown for example in FIG. 5B. The TDI sensor 908 images the spectrally dispersed light in TDI mode, performing time delay integration to produce a one-dimensional integrated image 910. The integrated image 910 captures multiple dispersion orders of the spectrally dispersed light. In the example of FIG. 9, pixels of the TDI sensor 908 are clocked in the x-direction and the integrated image 910 is one-dimensional in the y-dimension. The one-dimensional integrated image 910 is converted into an integrated spectrum 912 that shows the intensity of the spectrally dispersed light 904 by wavelength.

Figure 10:
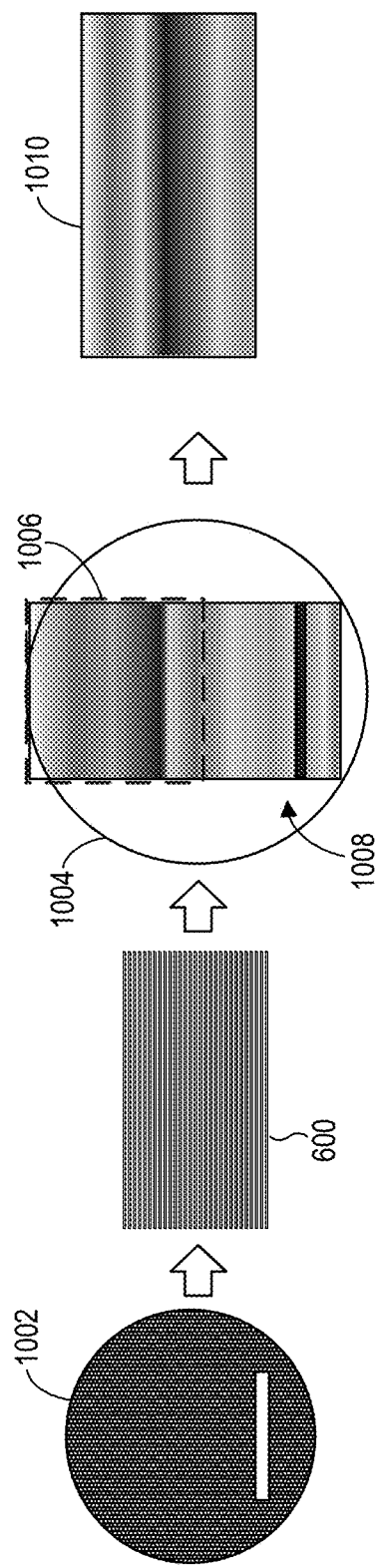
FIG. 10 illustrates spectral dispersion in a pupil plane in accordance with some embodiments.

FIG. 10 illustrates spectral dispersion in a pupil plane 1004 in accordance with some embodiments. An illumination pupil 1002 has slit illumination as provided by the slit aperture 901 (FIG. 9). The light for the slit illumination is spectrally dispersed by a line-space grating 600 (FIG. 6). The pupil plane 1004 for the resulting spectrally dispersed light includes a record region 1006 that is imaged by a TDI sensor (e.g., TDI sensor 908, FIG. 9) and a zeroth-order region 1008 that is not imaged. For example, the zeroth-order region 1008 is not imaged because the TDI sensor is offset in the imaging plane (e.g., as shown for the sensor 442, FIGS. 4B and 5B) or because a beam-blocking aperture 217 (FIG. 2B) blocks the zeroth-order region 1008 from reaching the TDI sensor. The TDI sensor, operating in TDI mode, produces a one-dimensional integrated image 1010, which is an example of the one-dimensional integrated image 910. An integrated spectrum (e.g., integrated spectrum 912, FIG. 9) may be generated based on the one-dimensional integrated image 1010.

The large spectral band of the OOB light leads to order mixing in the measured dispersion from the grating. The original spectrum may be recovered from the order-mixed dispersion. Let the original OOB spectrum to be recovered be S(λ). The TDI sensor 908 measure the one-dimensional dispersion, represented as $I_p(y)$, from a grating 600 of pitch p. The dispersion is assumed to be in the y-direction. The problem is thus to recover S(λ) from $I_p(y)$. First $I_p(y)$ is expressed explicitly. The grating with pitch p maps a given wavelength λ→y, the position coordinate, through a set of implicit functions $y=y_n(\lambda)$ that depend on the dispersion order n. The measured dispersion, however, does not uniquely isolate one of these dispersion orders and can be a strongly mixed sum of multiple dispersion orders. The total dispersion $I_p(y)$ of the spectrum S(λ) can thus be expressed as the sum of multiple individual order dispersions $I_{p,n}(y)$:

$$I_p(y) = \sum_n I_{p,n}(y) \quad (1)$$

-continued
$$I_{p,n}(y) = S(\lambda_{p,n}[y]) \times R_{p,n}(\lambda_{p,n}[y]). \quad (2)$$

Here, $R_{p,n}(\lambda)$ is the grating reflectivity/transmissivity response function for the nth diffraction order from a grating of pitch p and $\lambda_{p,n}[y]$ maps the spatial coordinate to the wavelength for the nth diffraction order and pitch p. Invoking the principal diffraction condition nλ=p sin (θ) with the approximation that sin (θ)~y/D, where D is the distance to the plane where the dispersion is measured, the diffraction condition can be approximated as nλ~p y/D. At a given point y in the dispersion plane and for a given pitch p, the wavelength contributions are hence discrete and can be represented as $$\lambda_{p,n}[y] \sim \frac{p}{D} \times \frac{y}{n}.$$

This forms the mapping function $\lambda_{p,n}[y]$. With this mapping function, the total spatial dispersion function $I_p(y)$ can be expanded as:

$$I_p(y) = \sum_n S(\lambda^p/n]) \times R_n\left(\frac{\lambda^p}{n}\right) \quad (3)$$

where $\lambda^p$=py/D represents the first order wavelength at position y.

The original OOB spectrum S(λ) may be recovered despite the presence of order mixing by analyzing multiple spectral measurements. The order mixing in the measured spectral dispersion can be classified into two categories. The first category is EUV-OOB mixing, in which intense higher EUV orders are entangled with the OOB dispersion band. The second category is OOB-OOB mixing, which involves inter-mixing of adjacent orders of OOB bands themselves.

Figure 11:
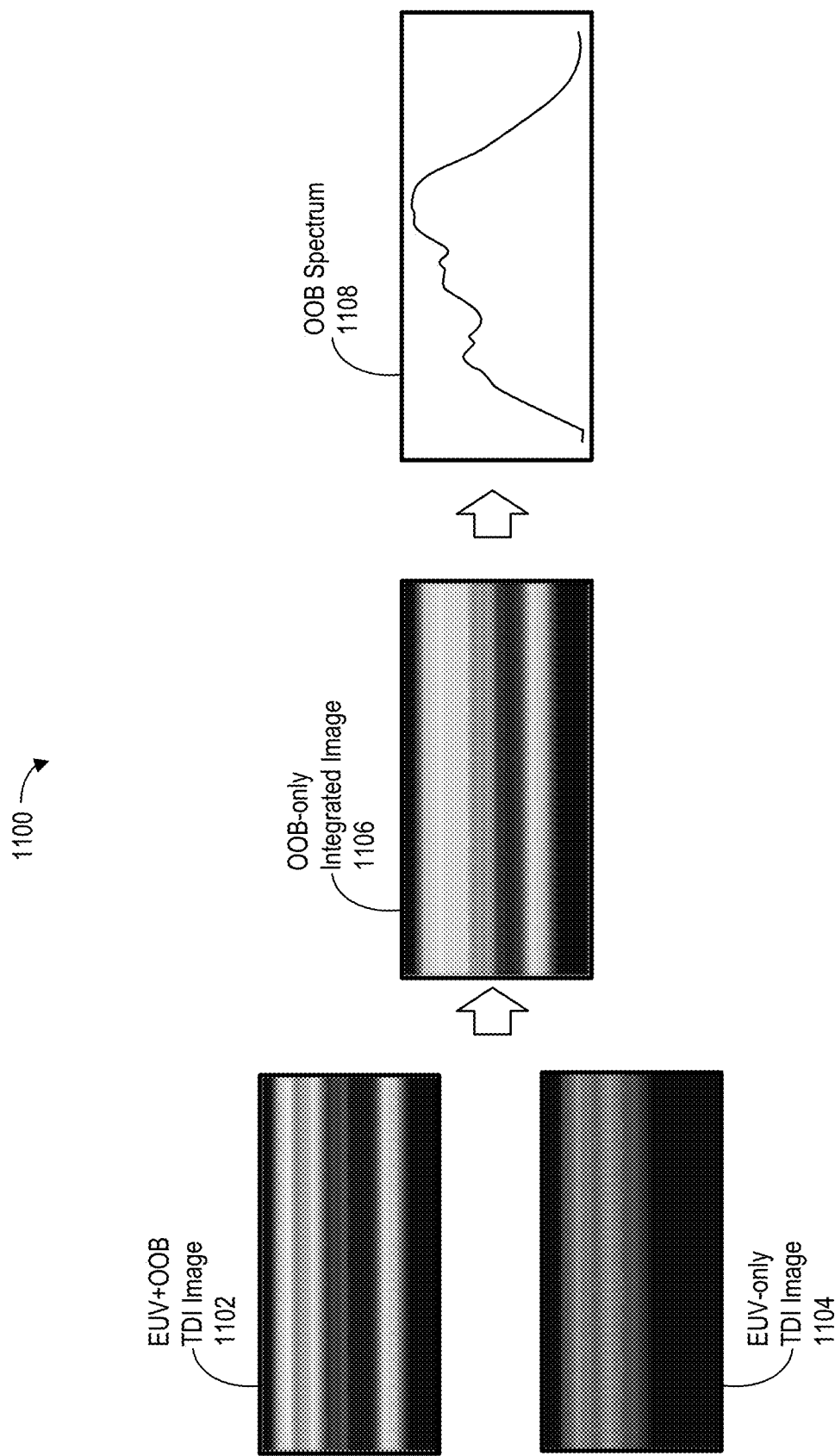
FIG. 11 shows a differential-measurement analysis process for measuring OOB light in accordance with some embodiments.

EUV-OOB mixing may be removed by performing differential measurements to eliminate the EUV content in the dispersion, resulting in substantially pure OOB content in the dispersion for analysis. FIG. 11 shows a differential-measurement analysis process 1100 in accordance with some embodiments. A first TDI image 1102 is recorded (e.g., by the TDI sensor 908, FIG. 9) that includes both OOB and EUV content in the dispersion (i.e., includes both OOB and EUV IB dispersed light). The first TDI image 1102 may be recorded, for example, using the image optics 200 (FIGS. 2A-2B) with the band-selection filter 210 being switched out of the optical path. A second TDI image 1104 is recorded (e.g., by the TDI sensor 908, FIG. 9) that includes only EUV content in the dispersion (i.e., includes only EUV IB light). The second TDI image 1104 may be recorded, for example, using the image optics 200 with the band-selection filter 210 being switched into the optical path. (Differential measurements use first and second TDI images 1102 and 1104 to characterize the OOB spectrum in a dual imaging mode. An alternate, non-differential approach is to measure the OOB content with a single image taken using a substrate that selectively transmits OOB-only light. For example, the single image may be taken using a COG substrate or a line-space grating 800 implemented on an EUV reticle, as shown in FIG. 8) or by using a filter 210 that selectively transmits OOB.

The first TDI image 1102 and second TDI image 1104 are differential measurements that are combined by subtracting the second TDI image 1104 from the first TDI image 1102 to produce a purified integrated image 1106. The purified integrated image 1106 includes substantially pure OOB content. A graph 1108 of the OOB spectrum is generated from the purified integrated image 1106. The graph 1108 of the OOB spectrum shows the intensity of the OOB light by wavelength (i.e., the y-axis is intensity and the x-axis is wavelength). The process 1100 thus removes higher-order EUV spectral content, thereby allowing the measurement of substantially pure OOB photons.

Figure 12:
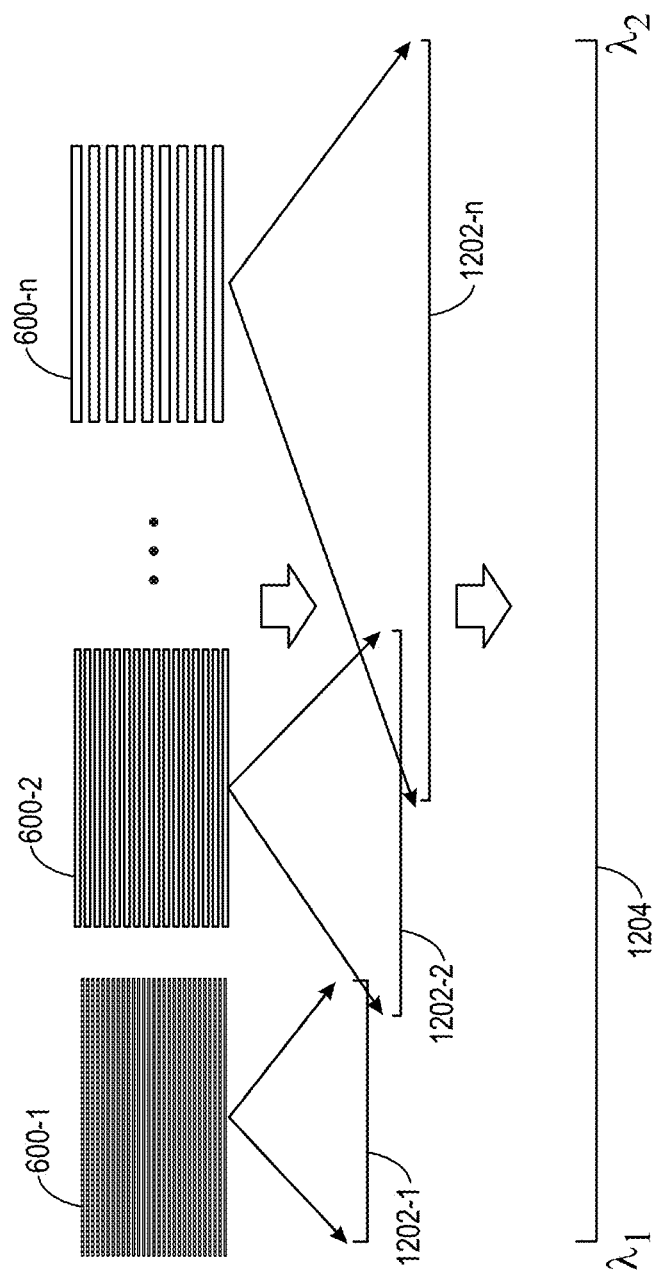
FIG. 12 shows multi-pitch dispersion capture, in which multiple spectral measurements are made using respective gratings with distinct pitches in order to measure respective OOB bands that collectively cover the full OOB spectrum, in accordance with some embodiments.

OOB-OOB order mixing may be disentangled and the original OOB spectrum S(λ) recovered using multiple spectral measurements made with respective gratings of a plurality of gratings with distinct pitches (e.g., a plurality of line-space gratings 600 with distinct respective pitches 606). FIG. 12 shows an example of this multi-pitch dispersion capture in which multiple spectral measurements are made using respective gratings with distinct pitches in order to measure respective OOB bands (i.e., respective OOB spectral windows) that collectively cover the full spectrum of OOB light. In FIG. 12, a plurality of line-space gratings 600 (FIG. 6) includes a first line-space grating 600-1 with a first pitch, a second line-space grating 600-2 with a second pitch, and so on, up to an nth line-space grating 600-n with an nth pitch, where n is an integer greater than two. Each of the line-space gratings 600 is positionable to spectrally disperse light in the second mode of operation. For example, each of the line-space gratings 600 is loaded into the chamber for a particular iteration of the second mode and is then unloaded from the chamber when that particular iteration of the second mode is complete. Alternatively, the plurality of line-space gratings 600 could all be patterned on the same characterization reticle. The first line-space grating 600-1 is used to disperse OOB light in a first band 1202-1, the second line-space grating 600-2 is used to disperse OOB light in a second band 1202-2, and so on, up to the nth line-space grating 600-n being used to disperse OOB light in an nth band 1202-n. The n bands 1202-1 through 1202-n together cover the full spectrum 1204 of OOB light, with overlap between adjacent bands 1202. The full spectrum 1204 of OOB light extends from a first wavelength $\lambda_1$ (e.g., ~50 nm) to a second wavelength $\lambda_2$ (e.g., ~1000 nm). The multiple measurements provide sufficient data redundancy to disentangle the order mixing in the OOB dispersion.

An iterative correction and recovery process is applied to the OOB dispersion measurements for the bands (i.e., spectral windows) 1202-1 through 1202-n to remove the artifacts of adjacent dispersion orders and thus to disentangle the OOB-OOB order mixing. In this process, a first spectral window (e.g., first band 1202-1), as characterized using a first grating (e.g., first line-space grating 600-1) with a first pitch, only has OOB light contributions from the first dispersion order. Because the first spectral window does not have contributions from any other order besides the first order, it is not order-mixed. The first spectral window seeds the iterative correction and recovery process. This first, non-order-mixed spectral window exists because the OOB spectral content for OOB wavelengths under 50 nm is negligible, due to filtering by reflections from multiple EUV mirrors in the long optical train extending to the TDI sensor. As FIG. 1 shows, EUV-mirror reflectivity for these short wavelengths is extremely low. Higher-order dispersion contributions from OOB wavelengths under 50 nm is therefore absent.

Figure 13:
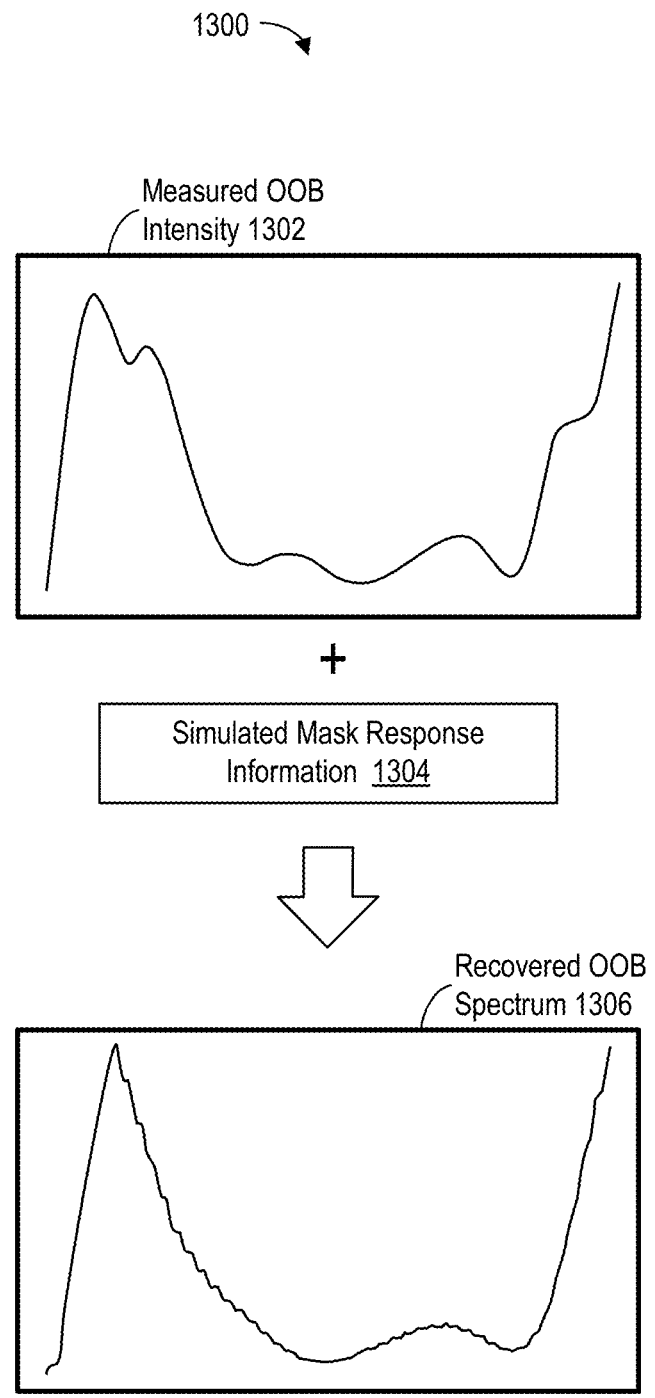
FIG. 13 shows a spectrum-recovery process in which a spectrum for a measured OOB spectral window is recovered using a mask-response simulator in accordance with some embodiments.

This absence of higher-order dispersion for the shortest OOB wavelengths allows a direct measurement of the first OOB spectral window (e.g., 50-100 nm wavelengths, as measured using a first grating with the smallest pitch for the sensor's capture range) without order mixing. The OOB spectrum for this first spectral window is recovered using a simulator for the mask response. FIG. 13 shows this spectrum-recovery process 1300 in accordance with some embodiments. A curve 1302 showing the measured intensity of OOB light in a particular band (e.g., one of the bands 1202, beginning with the first band 1202-1, FIG. 12) is analyzed using information 1304 for a simulated mask response (e.g., where the information 1304 specifies a mask-response transfer function). An OOB spectrum 1306 for the band is thereby recovered.

The order mixing in the next (i.e., second) spectral window (e.g., with wavelengths from 100 nm to some higher wavelength, as measured using a second grating with a larger pitch than the first grating), can then be mitigated (i.e., disentangled from the second spectral window) by estimating the contributions in the second spectral window from higher diffraction orders corresponding to the first-order light in the first spectral window (e.g., between 50-100 nm) and removing those contributions from the measurement for the second spectral window. Once the higher-order contributions in the second spectral window have been removed, thus clearing order-mixing artifacts from the second spectral window, the OOB spectrum for the second spectral window is recovered (e.g., in accordance with FIG. 13). This process is performed iteratively for successive spectral windows as measured using respective gratings of increasing pitch, until the order-mixing has been mitigated for all of the spectral windows. In this manner, deconvolution of the order-mixed dispersion is achieved.

Figure 14:
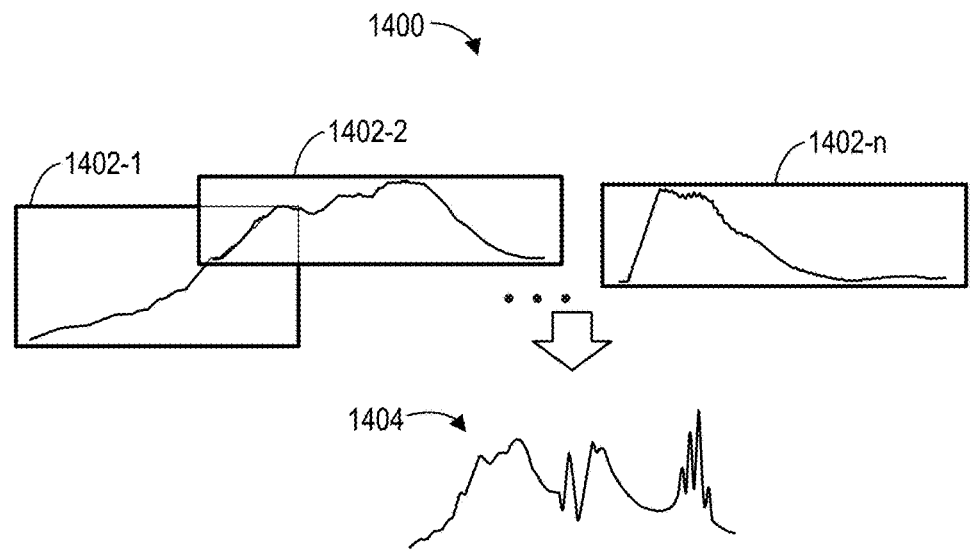
FIG. 14 illustrates a stitching process for stitching together corrected measurements of OOB light to recover the full OOB spectrum, in accordance with some embodiments.

Once order-mixing artifacts have been cleared from each spectral window, the full OOB spectrum is recovered by stitching together the recovered spectra for each spectral window. FIG. 14 illustrates this stitching process 1400 in accordance with some embodiments. A plurality of recovered OOB spectra 1402 for respective spectral windows (i.e., respective bands) includes a first recovered OOB spectrum 1402-1 for a first spectral window, a second recovered OOB spectrum 1402-2 for a second spectral window, and so on, up to an nth recovered OOB spectrum 1402-n for an nth spectral window, where n is an integer greater than two. The plurality of recovered OOB spectra 1402 is stitched together into a single recovered OOB spectrum 1404 (e.g., for the full OOB spectrum and thus the full range of OOB wavelengths).

Figure 15:
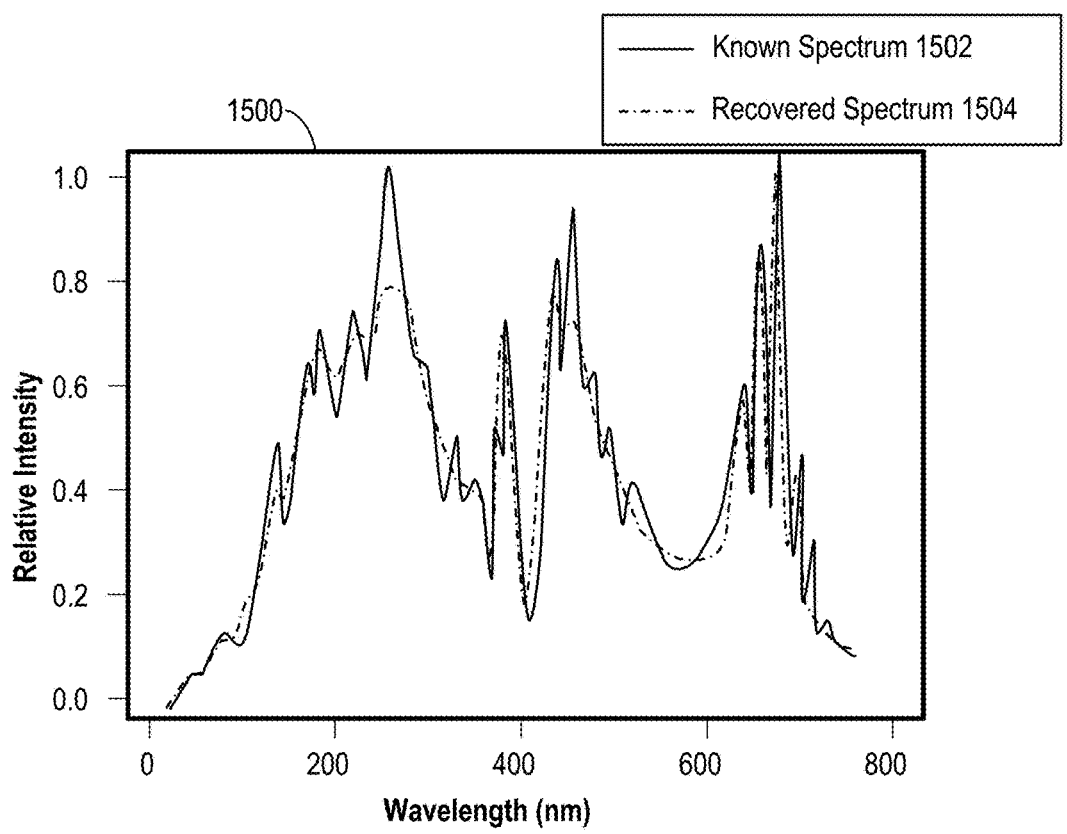
FIG. 15 shows a graph comparing a recovered OOB spectrum to a known OOB spectrum for the same OOB light, in accordance with some embodiments.

FIG. 15 shows a graph 1500 illustrating a prophetic comparison, for the same OOB light, of an OOB spectrum 1504 recovered as disclosed herein to a known spectrum 1502 for the OOB light (i.e., a "gold standard" measurement for the OOB light). The graph 1500 is the result of a simulation. The recovered OOB spectrum 1504 was simulated using the iterative recovery described above for FIGS. 12-14. The known OOB spectrum 1502 was generated by simulating forward propagation. The simulation was performed for an APMI system with a transmissive filter 210 that transmits EUV light and filters out OOB light and the data simulated was an OOB dispersion from a differential measurement. As shown, the recovered OOB spectrum 1504 is quite accurate.

Figure 16:
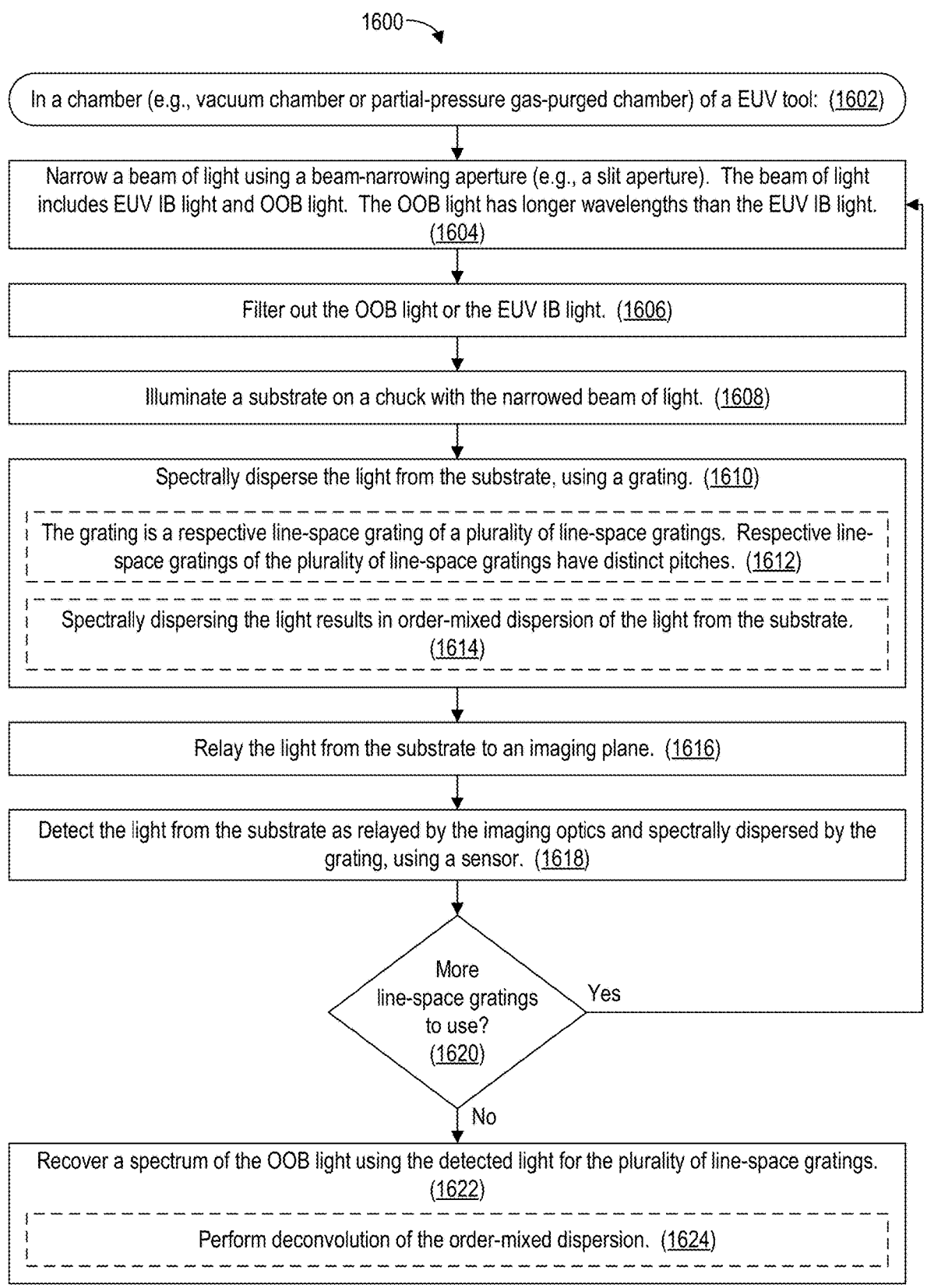
FIG. 16 is a flowchart showing an OOB characterization method in accordance with some embodiments.

FIG. 16 is a flowchart showing an OOB characterization method 1600 in accordance with some embodiments. The method 1600 is performed (1602) in a chamber (e.g., chamber 202, FIGS. 2A-2B; 402, FIGS. 4A-4B, or 502, FIGS. 5A-5B) of an EUV tool (e.g., EUV tool 1730, FIG. 17), with the exception of the spectrum recovery step 1622, which may be performed by a computer system of the EUV tool or a computer system communicatively coupled with the EUV tool (e.g., the computer system of the EUV system 1700, FIG. 17). In some embodiments, the chamber is a vacuum chamber or a partial-pressure gas-purged chamber.

In the method 1600, a beam of light is narrowed (1604) using a beam-narrowing aperture (e.g., beam-narrowing 206), resulting for example in the narrowed beam 230 (FIG. 2B) or 430 (FIG. 4B or 5B). The beam-narrowing aperture may be a slit aperture (e.g., slit aperture 901, FIG. 9) or an aperture with a different shape (e.g., a pinhole aperture). The beam of light includes EUV IB light and OOB light. The OOB light has longer wavelengths than the EUV IB light.

Either the OOB light or the EUV IB light is filtered out (1606). For example, the band-selection filter 210 (FIG. 2B) filters out the OOB light while transmitting the EUV IB light. In another example, the characterization reticle 416 (FIG. 4B) filters out the EUV light while dispersing the OOB light. In still another example, the characterization reticle 516 (FIG. 5B) filters out the EUV light while reflecting the OOB light.

A substrate (e.g., characterization substrate 216, FIG. 2B; characterization reticle 416, FIG. 4B; characterization reticle 516, FIG. 5B) on a chuck (e.g., chuck 214, FIGS. 2A-2B, 4A-4B, or 5A-5B) is illuminated (1608) with the narrowed beam of light. The light from the substrate is spectrally dispersed (1610), using a grating (e.g., a line-space grating 600, FIG. 6). The grating may be on the substrate (e.g., on the characterization substrate 216, FIG. 2B, or on the characterization reticle 416, FIG. 4B) or may be distinct from the substrate (e.g., on the characterization wafer 522, FIG. 5B). In some embodiments, the grating is (1612) a respective line-space grating of a plurality of line-space gratings (e.g., is one of the line-space gratings 600-1 through 600-n, FIG. 12). Respective line-space gratings of the plurality of line-space gratings have distinct pitches. Spectrally dispersing the light results (1614) in order-mixed dispersion of the light from the substrate.

The light is relayed (1616) from the substrate to an imaging plane (e.g., imaging plane 226, FIGS. 2A-2B, or 426, FIGS. 4A-4B or 5A-5B). This light is far-field light with respect to the substrate and does not include image information for the substrate (i.e., cannot be used to generate an image of the substrate). In some embodiments, the light is relayed by spectral imaging optics (e.g., spectral imaging optics 222, FIG. 2B) that are separate from the imaging optics (e.g., imaging optics 220, FIG. 2A) used during regular operation (e.g., production operation) of the EUV tool. Alternatively, the light is relayed by the same imaging optics (e.g., imaging optics 420, FIGS. 4A-4B or 5A-5B) used during regular operation (e.g., production operation) of the EUV tool. In the examples of FIGS. 4A-4B and FIGS. 5A-5B, the light is relayed not only to the imaging plane 426 but beyond it to the sensor plane 440.

The light from the substrate as relayed by the imaging optics and spectrally dispersed by the grating is detected (1618) using a sensor (e.g., sensor 224, FIGS. 2A-2B, or 442, FIGS. 4A-4B or 5A-5B). The sensor may be a CCD camera. In some embodiments, the sensor is a TDI sensor (e.g., TDI sensor 908, FIG. 9).

If the filtering step 1606 filters out the OOB light, two iterations of steps 1604-1618 may be performed for each line-space grating of the plurality of line-space gratings, with the filtering step 1606 being included in one of the two iterations and being omitted in the other of the two iterations. These two iterations together produce a differential measurement of the OOB light for the OOB spectral window corresponding to the pitch of the line-space grating (e.g., per the process 1100, FIG. 11).

If more line-space gratings of the plurality of line-space gratings remain to be used (i.e., have not yet been used) for OOB characterization measurements (1620—Yes), then the method 1600 returns to step 1604, and steps 1604-1618 are performed again using one of the remaining line-space gratings. In this manner, dispersion of the OOB light in different bands 1202-1 through 1202-n (FIG. 12) (i.e., in different spectral windows) may be measured.

If all of the line-space gratings have been used for OOB characterization measurements (1620—No), such that an iteration of steps 1604-1620 (or two iterations, in the case of differential measurements) has been performed for each line-space grating of the plurality of line-space gratings, then a spectrum of the OOB light is recovered (1622) using the detected light for the plurality of line-space gratings. Recovering the spectrum of OOB light may include performing (1624) deconvolution of the order-mixed dispersion. Recovery of the spectrum characterization may be performed as described for FIGS. 13-14.

In some embodiments, the results of the method 1600 are used to remove image artifacts from OOB light in EUV images for EUV inspection and imaging applications (e.g., while still achieving high throughput). The results may also or alternatively be used for system diagnostics and control and for preventive maintenance of EUV tools.

Figure 17:
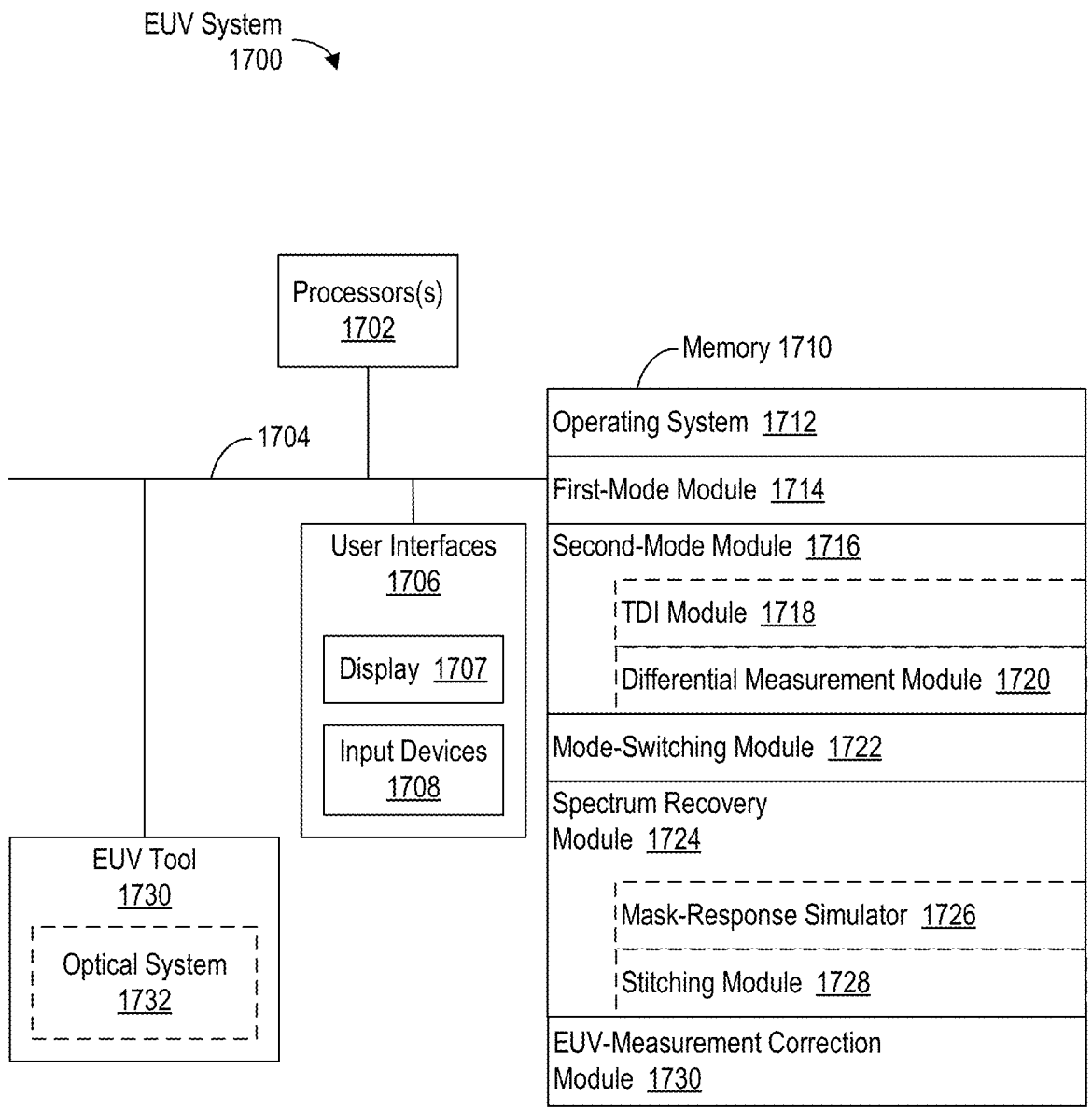
FIG. 17 is a block diagram of an EUV system in accordance with some embodiments.

FIG. 17 is a block diagram of an EUV system 1700 in accordance with some embodiments. The EUV system 1700 includes an EUV tool 1730 and a computer system with one or more processors 1702 (e.g., CPUs), user interfaces 1706, memory 1710, and communication bus(es) 1704 interconnecting these components. The computer system alternatively may be communicatively coupled with the EUV tool 1730 through one or more networks. The computer system may further include one or more network interfaces (wired and/or wireless, not shown) for communicating with the EUV tool 1730 and/or remote computer systems. The EUV tool 1730 includes an optical system 1732 (e.g., optical system 200, FIGS. 2A-2B; 400, FIGS. 4A-4B; or 500, FIGS. 5A-5B). In some embodiments, the EUV tool is an APMI tool, an actinic reticle imaging and review system, or an EUV scanner.

The user interfaces 1706 may include a display 1707 and one or more input devices 1708 (e.g., a keyboard, mouse, touch-sensitive surface of the display 1707, etc.). The display 1707 may display results of the method 1600 (FIG. 16) and/or the results of EUV images or measurements that are corrected using a recovered OOB spectrum (e.g., as recovered using the method 1600).

Memory 1710 includes volatile and/or non-volatile memory. Memory 1710 (e.g., the non-volatile memory within memory 1710) includes a non-transitory computer-readable storage medium. Memory 1710 optionally includes one or more storage devices remotely located from the processors 1702 and/or a non-transitory computer-readable storage medium that is removably inserted into the computer system. In some embodiments, memory 1710 (e.g., the non-transitory computer-readable storage medium of memory 1710) stores the following modules and data, or a subset or superset thereof: an operating system 1712 that includes procedures for handling various basic system services and for performing hardware-dependent tasks; a first-mode module 1714 for performing regular (e.g., production) operation of the EUV tool 1730 in the first mode; a second-mode module 1716 for measuring OOB light in the EUV tool 1730 in the second mode; a mode-switching module 1722 for reconfiguring the EUV tool 1730 for the first and second modes; a spectrum-recovery module 1724 for analyzing OOB measurements to recover an OOB spectrum for the EUV tool 1730; and an EUV-measurement correction module 1730 to correct EUV measurements or images taken by the EUV tool 1730, based on the recovered OOB spectrum. In some embodiments, the second-mode module 1716 includes a TDI module 1718 for generating TDI images (e.g., images 910, FIG. 9; 1010, FIGS. 10; 1102 and 1104, FIG. 11) and a differential measurement module 1720 for generating EUV-plus-OOB and EUV-only images (e.g., images 1102 and 1104, FIG. 11) and for recovering an OOB-only image (e.g., image 1106, FIG. 11) from the EUV-plus-OOB and EUV-only images. In some embodiments, the spectrum-recovery module 1724 includes a mask-response simulator 1726 used to recover an OOB spectrum from an OOB measurement (e.g., that provides simulated mask-response information 1304, FIG. 13) and a stitching module 1728 for stitching recovered OOB spectra (e.g., OOB spectra 1402, FIG. 14) for respective spectral windows into a single recovered OOB spectrum (e.g., OOB spectrum 1404, FIG. 14). The memory 1710 (e.g., the non-transitory computer-readable storage medium of the memory 1710) includes instructions for performing all or a portion of the method 1600 (FIG. 16).

Each of the modules stored in the memory 1710 corresponds to a set of instructions for performing one or more functions described herein. Separate modules need not be implemented as separate software programs. The modules and various subsets of the modules may be combined or otherwise re-arranged. In some embodiments, the memory 1710 stores a subset or superset of the modules and/or data structures identified above.

FIG. 17 is intended more as a functional description of various features that may be present in a EUV system than as a structural schematic. For example, the functionality of the computer system in the EUV system 1700 may be split between multiple devices. A portion of the modules stored in the memory 1710 may alternatively be stored in one or more other computer systems communicatively coupled with the computer system of the EUV system 1700 through one or more networks.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A system, comprising:
    a chamber of an EUV tool;
    a chuck in the chamber, on which a substrate is to be mounted;
    an illumination aperture in the chamber to provide a beam of light to illuminate the substrate on the chuck, the beam of light comprising extreme ultraviolet (EUV) in-band (IB) light and out-of-band (OOB) light, the OOB light having longer wavelengths than the EUV IB light;
    a beam-narrowing aperture in the chamber to selectively narrow the beam of light to illuminate the substrate, the beam-narrowing aperture being switchable into and out of a path for the beam of light;
    a band-selection filter to filter out the OOB light or the EUV IB light;
    imaging optics in the chamber to relay light from the substrate to an imaging plane;
    a grating to spectrally disperse the light from the substrate; and
    a sensor in the chamber to detect the light from the substrate as relayed by the imaging optics and spectrally dispersed by the grating.

2. The system of claim 1, wherein the beam-narrowing aperture is a slit aperture or a pinhole aperture.

3. The system of claim 1, wherein:
    the EUV tool is operable in a first mode of operation and a second mode of operation;
    the substrate is a production reticle in the first mode of operation and is a characterization reticle distinct from the production reticle in the second mode of operation;
    the illumination aperture is to provide the beam of light to illuminate the production reticle in the first mode of operation; and
    the beam-narrowing aperture is to narrow the beam of light to illuminate the characterization reticle in the second mode of operation.

4. The system of claim 3, wherein the EUV tool is selected from the group consisting of a tool for mapping defects on production reticles and a tool for imaging mapped defects on production reticles.

5. The system of claim 4, wherein:
    the band-selection filter is switchable into and out of the path for the beam of light; and
    the band-selection filter is to transmit the EUV IB light and filter out the OOB light.

6. The system of claim 4, wherein:
    the band-selection filter is switchable into and out of the path for the beam of light; and
    the band-selection filter is to transmit the OOB light and filter out the EUV IB light.

7. The system of claim 4, wherein:
    the grating is a line-space grating; and
    the characterization reticle comprises the line-space grating.

8. The system of claim 7, wherein:
    the characterization reticle further comprises the band-selection filter; and
    the band-selection filter is to reflect the OOB light and filter out the EUV IB light.

9. The system of claim 7, further comprising a beam-blocking aperture to block zeroth-order spectrally dispersed light from the characterization reticle.

10. The system of claim 4, wherein:
    the imaging optics comprise:
        first imaging optics to relay light from the production reticle to the imaging plane in the first mode, and
        second imaging optics to relay the spectrally dispersed light from the characterization reticle to the imaging plane in the second mode; and
    the sensor is situated in the imaging plane to image the production reticle and to detect the spectrally dispersed light.

11. The system of claim 10, wherein:
    the first imaging optics comprise a first plurality of EUV mirrors;
    the second imaging optics comprise a second plurality of EUV mirrors;

the number of EUV mirrors in the first plurality of EUV mirrors equals the number of EUV mirrors in the second plurality of EUV mirrors; and the first plurality of EUV mirrors and the second plurality of EUV mirrors have substantially the same reflectivity.

12. The system of claim 3, wherein:

the EUV tool is an EUV scanner;

the chuck is a first chuck;

in the first mode of operation, the EUV scanner is to photolithographically expose a production wafer using light from the production reticle;

the system further comprises a second chuck to hold the production wafer in the imaging plane in the first mode of operation; and the sensor is situated in a sensor plane beyond the imaging plane and is offset in the sensor plane to avoid zeroth-order spectrally dispersed light from the characterization reticle.

13. The system of claim 12, wherein the imaging optics are to relay light from the characterization reticle to the sensor and from the production reticle to the production wafer.

14. The system of claim 12, wherein:

the grating is a line-space grating; and the characterization reticle comprises:
the line-space grating; and
the band-selection filter, wherein the band-selection filter is to reflect the OOB light and filter out the EUV IB light.

15. The system of claim 12, wherein:

the characterization reticle comprises the band-selection filter, wherein the band-selection filter is to reflect the OOB light and filter out the EUV IB light; and the grating is a line-space grating on a characterization wafer distinct from the production wafer; and the characterization wafer is to be positioned in the imaging plane in the path of the light as relayed by the imaging optics in the second mode.

16. The system of claim 1, wherein:

the EUV tool is operable in a first mode of operation and a second mode of operation;

the substrate is a production substrate in the first mode of operation and is a characterization substrate distinct from the production substrate in the second mode of operation;

the illumination aperture is to provide the beam of light to illuminate the production substrate in the first mode of operation; and the beam-narrowing aperture is to narrow the beam of light to illuminate the characterization substrate in the second mode of operation.

17. The system of claim 16, wherein:

the beam-narrowing aperture is a slit aperture;

the grating is a line-space grating;

the characterization substrate comprises the line-space grating; and the sensor is a time delay integration (TDI) sensor operable in a TDI mode or a frame mode.

18. The system of claim 17, wherein the substrate is to remain stationary when the TDI sensor detects the light from the substrate as relayed by the imaging optics and spectrally dispersed by the line-space grating.

19. The system of claim 16, wherein:

the grating is a line-space grating;

the characterization substrate is a reticle comprising the line-space grating; and the line-space grating comprises an alternating series of EUV-absorber lines and bare-quartz spaces.

20. The system of claim 16, wherein:

the grating is a first line-space grating;

the system comprises a plurality of line-space gratings including the first line-space grating;

each line-space grating of the plurality of line-space gratings is positionable to spectrally disperse the light in the second mode of operation; and respective line-space gratings of the plurality of line-space gratings have distinct pitches.

21. A method, comprising, in a chamber of a EUV tool:

narrowing a beam of light using a beam-narrowing aperture, the beam of light comprising extreme ultraviolet (EUV) in-band (IB) light and out-of-band (OOB) light, the OOB light having longer wavelengths than the EUV IB light;

filtering out the OOB light or the EUV IB light;

illuminating a substrate on a chuck with the narrowed beam of light;

spectrally dispersing the light from the substrate, using a grating;

relaying the light from the substrate to an imaging plane; and detecting the light from the substrate as relayed by the imaging optics and spectrally dispersed by the grating, using a sensor.

22. The method of claim 21, wherein:

the grating is a first line-space grating of a plurality of line-space gratings, wherein respective line-space gratings of the plurality of line-space gratings have distinct pitches;

the method comprises, in the chamber, repeating the narrowing, the filtering, the illuminating, the spectrally dispersing, the relaying, and the detecting for each line-space grating of the plurality of line-space gratings; and the method further comprises recovering a spectrum of the OOB light using the detected light for the plurality of line-space gratings.

23. The method of claim 22, wherein:

spectrally dispersing the light from the substrate results in order-mixed dispersion of the light from the substrate; and recovering the spectrum of the OOB light comprises performing deconvolution of the order-mixed dispersion.

* * * * *